(12) United States Patent
Ogino et al.

(10) Patent No.: US 11,114,484 B2
(45) Date of Patent: Sep. 7, 2021

(54) PHOTOELECTRIC CONVERSION APPARATUS, PHOTOELECTRIC CONVERSION SYSTEM, MOVING BODY, AND MANUFACTURING METHOD FOR PHOTOELECTRIC CONVERSION APPARATUS

(71) Applicant: CANON KABUSHIKI KAISHA, Tokyo (JP)

(72) Inventors: Takumi Ogino, Koganei (JP); Hideaki Ishino, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 27 days.

(21) Appl. No.: 16/425,190

(22) Filed: May 29, 2019

(65) Prior Publication Data

US 2019/0371836 A1 Dec. 5, 2019

(30) Foreign Application Priority Data

Jun. 4, 2018 (JP) ............................. JP2018-107035

(51) Int. Cl.
*H01L 27/146* (2006.01)

(52) U.S. Cl.
CPC .... *H01L 27/1462* (2013.01); *H01L 27/14612* (2013.01); *H01L 27/14627* (2013.01)

(58) Field of Classification Search
CPC ........... H01L 27/1462; H01L 27/14627; H01L 27/14612; H01L 27/14605; H01L 27/1464; H01L 27/14623; H01L 27/14614
See application file for complete search history.

(56) References Cited

U.S. PATENT DOCUMENTS

| 2009/0090988 | A1  | 4/2009 | Ohgishi |                      |
|--------------|-----|--------|---------|----------------------|
| 2009/0189235 | A1  | 7/2009 | Ikeda   |                      |
| 2010/0233861 | A1  | 9/2010 | Kimizuka|                      |
| 2014/0054662 | A1* | 2/2014 | Yanagita| H01L 27/14614 257/291 |
| 2015/0002713 | A1* | 1/2015 | Nomura  | H01L 27/14621 348/302 |

(Continued)

FOREIGN PATENT DOCUMENTS

JP     2008-306154 A     12/2008

*Primary Examiner* — Julia Slutsker
(74) *Attorney, Agent, or Firm* — Canon U.S.A., Inc. IP Division

(57) ABSTRACT

A photoelectric conversion apparatus includes, a semiconductor substrate having a photoelectric conversion unit performing photoelectric conversion on entering light and accumulating first electric charges, a first transistor electrically connected to the photoelectric conversion unit and having a first gate on a second surface, and a second transistor having a second gate shorter than the first gate on the second surface, a first fixed charge film continuously provided directly or with an insulating film in between in an area overlapping the photoelectric conversion unit on a first surface and the second transistor, the first fixed charge film having fixed charges of the first polarity, and a second fixed charge film provided directly or with an insulating film in between in an area overlapping the second transistor and the first fixed charge film, the second fixed charge film having fixed charges of a second polarity.

19 Claims, 16 Drawing Sheets

(56) References Cited

U.S. PATENT DOCUMENTS

| | | | |
|---|---|---|---|
| 2015/0091121 A1* | 4/2015 | Manda | H01L 27/14636 |
| | | | 257/443 |
| 2015/0187826 A1* | 7/2015 | Suzuki | H01L 27/14625 |
| | | | 348/281 |
| 2019/0103426 A1* | 4/2019 | Tanaka | G01N 21/64 |

* cited by examiner

PHOTOELECTRIC CONVERSION APPARATUS, PHOTOELECTRIC CONVERSION SYSTEM, MOVING BODY, AND MANUFACTURING METHOD FOR PHOTOELECTRIC CONVERSION APPARATUS

BACKGROUND OF THE INVENTION

Field of the Invention

The aspect of the embodiments relates to a photoelectric conversion apparatus, a photoelectric conversion system, a moving body, and a manufacturing method for the photoelectric conversion apparatus.

Description of the Related Art

A photoelectric conversion apparatus has been known which has a semiconductor substrate including a pixel area having a plurality of photodiodes (which will also be called "PDs") that accumulate electrons and a peripheral circuit area. As an example of the photoelectric conversion apparatus, a so-called back-side illumination type photoelectric conversion apparatus is available that has a semiconductor substrate having PDs between a microlens array and a wiring layer. A technology (such as Japanese Patent Laid-Open No. 2008-306154) applicable to the photoelectric conversion apparatus has been proposed that has a film having negative fixed charges on a light receiving surface side of the PDs to form a hole accumulation layer in vicinity of the light receiving surface of the PDs. In the photoelectric conversion apparatus according to Japanese Patent Laid-Open No. 2008-306154, providing the film having negative fixed charges may reduce charges due to an interface state between the PDs and the film provided on the light receiving surface of the PDs from changing to dark current.

Referring to FIG. 7 in Japanese Patent Laid-Open No. 2008-306154, a film having positive fixed charges is provided in the peripheral circuit area, and a film having negative fixed charges is provided on an upper surface of the film having positive fixed charges and the light receiving surface of the PDs so that malfunctions of a peripheral circuit therein can be reduced.

A manufacturing method for the photoelectric conversion apparatus includes, first, forming a film having positive fixed charges in the peripheral circuit area of the semiconductor substrate and the light receiving surface of the PDs. Next, the film having positive fixed charges formed on the light receiving surface of the PDs is etched for removal with leaving the film having positive fixed charges provided in the peripheral circuit area. Next, a film having negative fixed charges is formed on the upper surfaces of the film having positive fixed charges left in the peripheral circuit area and the light receiving surface of the PDs.

In the method of the related art for manufacturing the photoelectric conversion apparatus, the PDs may be damaged by the etching for removing the film having positive fixed charges. There is a possibility that the damage on the PDs increases the noise component included in output signal from the PDs.

In the photoelectric conversion apparatus of the related art, the polarities of the films having fixed charges arranged in vicinity of a semiconductor substrate vary in accordance with the areas. A film having negative fixed charges is arranged in vicinity of the pixel area having PDs, and a film having positive fixed charges is arranged in vicinity of the peripheral circuit area. In other words, the polarity of the film having fixed charges arranged in vicinity of the semiconductor substrate is different between the pixel area and the peripheral circuit area. In such a configuration, there is an area where the film having negative fixed charges has an increased film thickness. The area with the increased film thickness undesirably has a higher carrier concentration of a carrier accumulation layer caused in the semiconductor substrate, compared with the other areas. Such an area may easily occur particularly in a boundary portion between the pixel area and the peripheral circuit area. Transistors having shorter gate lengths tend to be provided in the peripheral circuit area than in the pixel area, and the transistors having relatively shorter gate lengths in the boundary portion may cause a malfunction due to an electric potential distribution caused in an area having the increased carrier concentration in the semiconductor substrate.

SUMMARY OF THE INVENTION

A photoelectric conversion apparatus according to an aspect of the embodiments includes a semiconductor substrate having a first surface, to which light enters, and a second surface facing the first surface, and having a photoelectric conversion unit performing photoelectric conversion on the entering light and accumulating first electric charges of a first polarity, a first transistor having a first gate formed on the second surface, and a second transistor having a second gate formed on the second surface, the second gate having a gate length shorter than a gate length of the first gate, a first fixed charge film provided on the first surface directly or with an insulating film in between in an area overlapping the photoelectric conversion unit and the second transistor in a planer view, the first fixed charge film having fixed charges of the first polarity, and a second fixed charge film provided directly or with an insulating film in between in an area overlapping the second transistor and the first fixed charge film in the planer view, the second fixed charge film having fixed charges of a second polarity.

A manufacturing method for a photoelectric conversion apparatus according to another aspect of the embodiments, the method includes in order preparing a semiconductor substrate having a first surface, to which light enters, and a second surface facing the first surface, and having a photoelectric conversion unit performing photoelectric conversion on the entering light and accumulating first electric charges of a first polarity, a first transistor having a first gate formed on the second surface, and a second transistor having a second gate formed on the second surface, the second gate having a gate length shorter than a gate length of the first gate, forming a first film provided on the first surface directly or with an insulating film in between in an area overlapping the photoelectric conversion unit and the second transistor in a planer view and containing at least one of hafnium oxide, aluminum oxide, and tantalum oxide, forming a second film on a side of the first film opposite to a side of the semiconductor substrate provided directly or with an insulating film in between in an area overlapping the photoelectric conversion unit and the second transistor in the planer view and containing at least one of silicon oxide and silicon nitride, the silicon oxide having an O/Si ratio equal to or higher than 1.50 and equal to or lower than 1.85, and removing the second film while leaving the first film in an area overlapping the photoelectric conversion unit in the planer view.

Further features of the disclosure will become apparent from the following description of exemplary embodiments with reference to the attached drawings.

DESCRIPTION OF THE EMBODIMENTS

Figure 1:
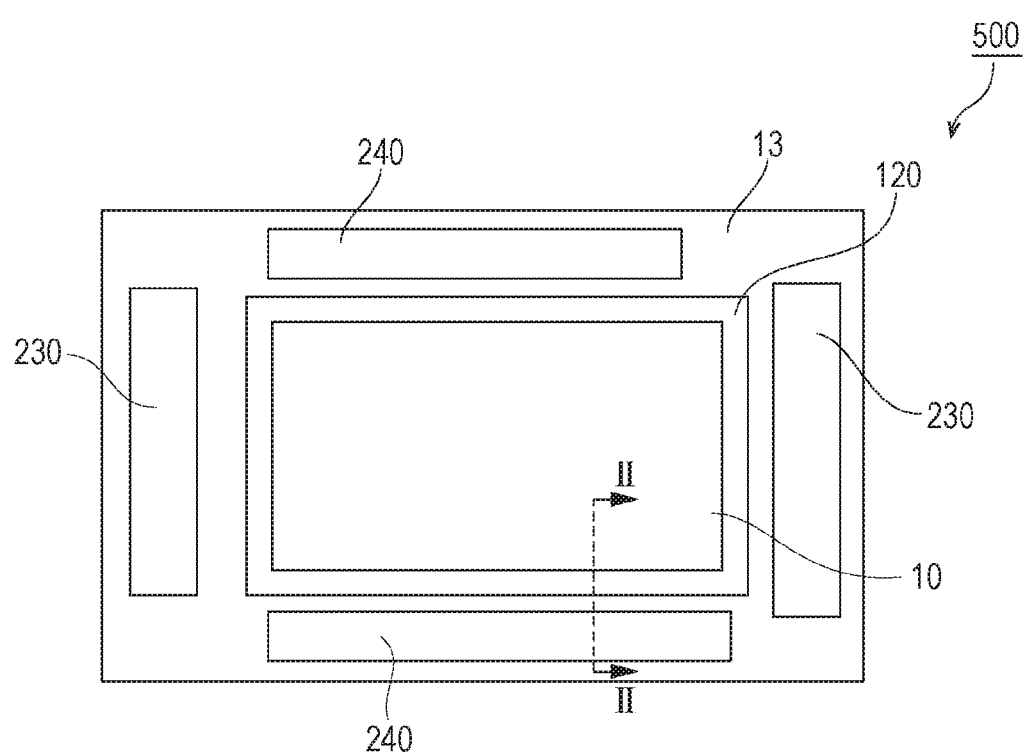
FIG. 1 is a schematic top view of a photoelectric conversion apparatus according to a first embodiment of the disclosure.

Modes that embody the aspect of the embodiments will be described below with reference to the drawings. The following modes embody the technical spirit of aspect of the embodiments and do not limit the aspect of the embodiments. The sizes of and positional relationships between members may be illustrated in the drawings in an exaggerated manner for clear illustration. The following description assumes that a first polarity is a negative polarity and a second polarity is a positive polarity. However, the same effects can be obtained if the first polarity is a positive polarity and the second polarity is a negative polarity. For convenience of description, the light receiving surface side of the semiconductor substrate 2 is assumed as an upper side, and a surface side facing the upper side is assumed as a lower side.

First Embodiment

Figure 2:
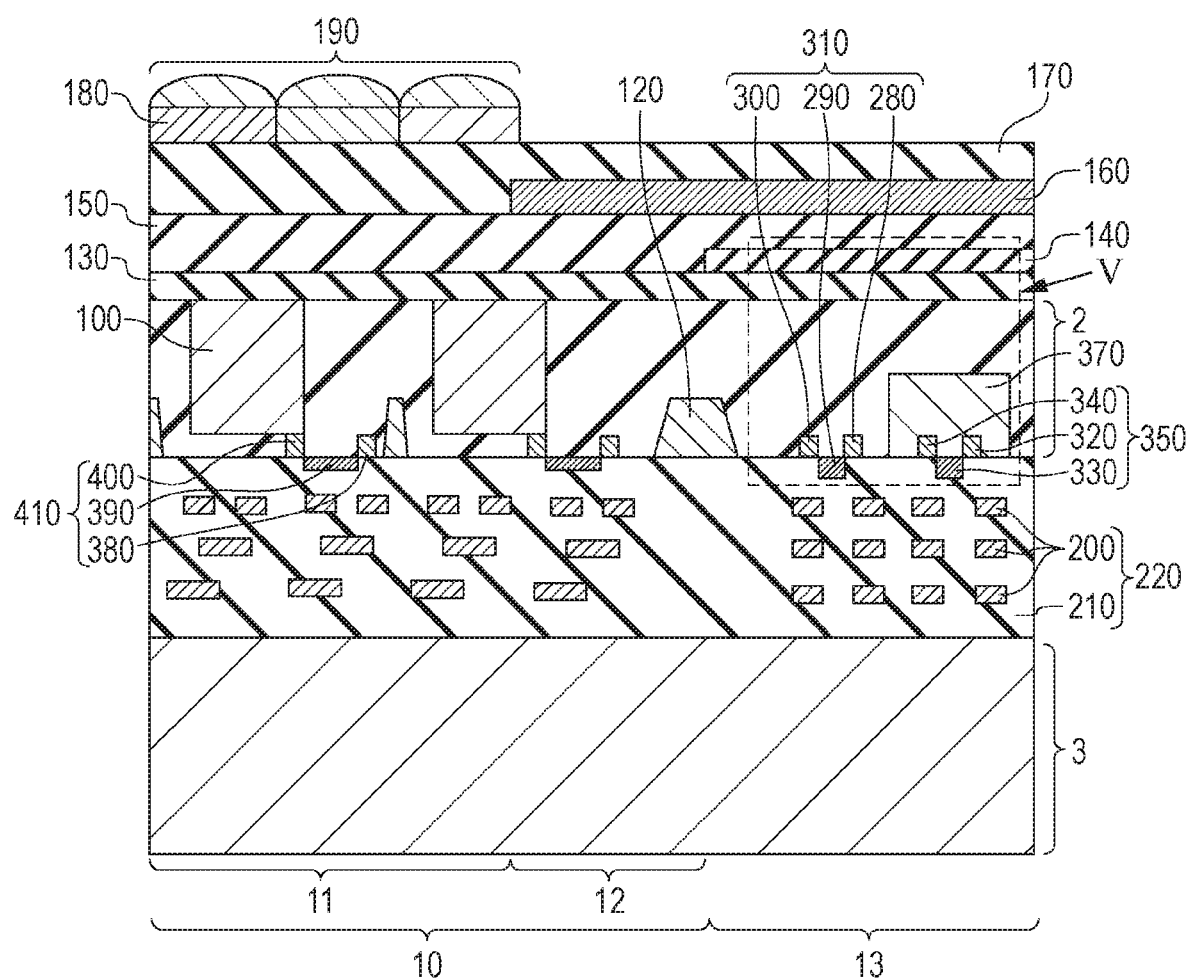
FIG. 2 is a schematic sectional view taken at a line II-II in FIG. 1 of the photoelectric conversion apparatus according to the first embodiment of the disclosure.
Figure 3:
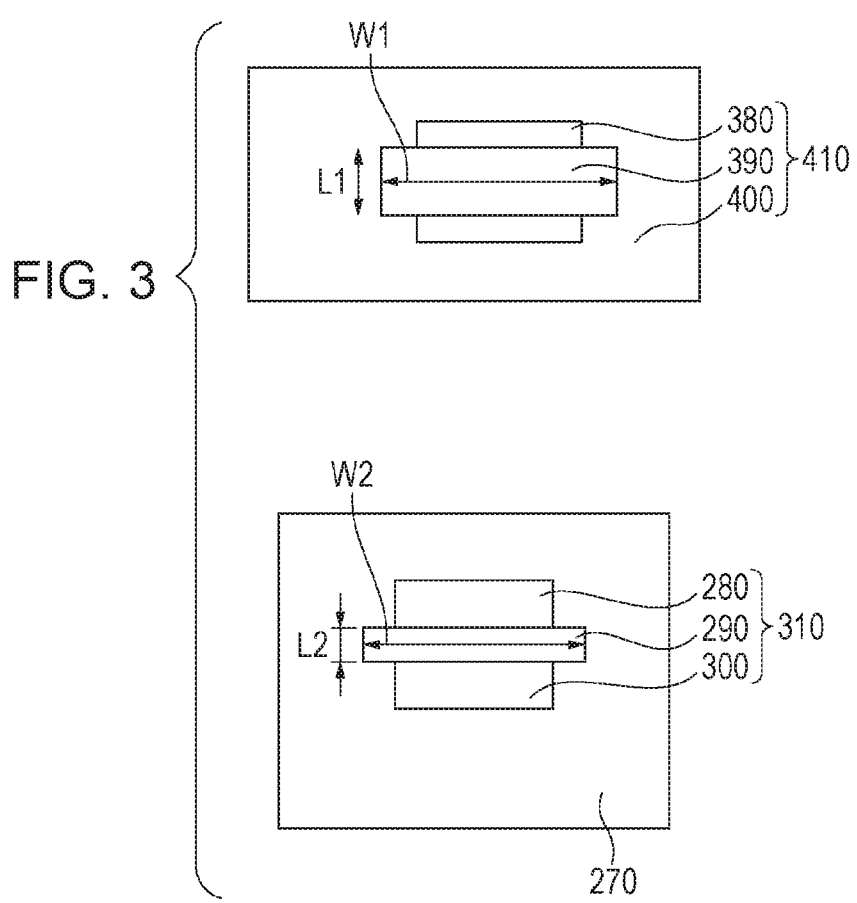
FIG. 3 is a diagram illustrating gate lengths of a first transistor and a second transistor.
Figure 5:
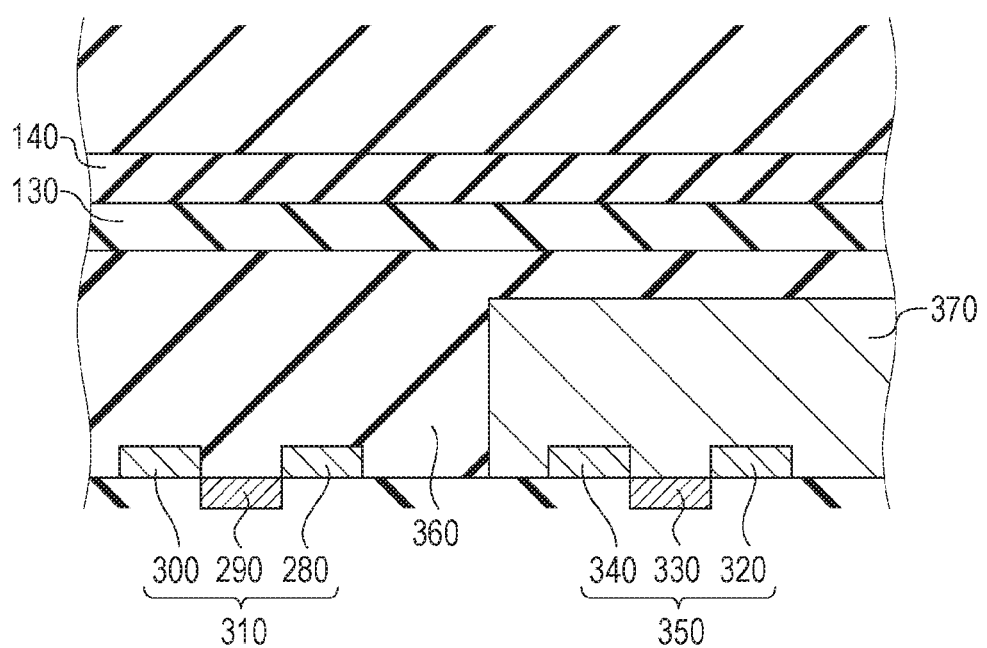
FIG. 5 is an enlarged diagram illustrating a part enclosed by a broken line in FIG. 2.

FIG. 1 illustrates a schematic top view of a photoelectric conversion apparatus 500 according to a first embodiment. FIG. 2 is a schematic sectional view taken at a line II-II in FIG. 1. FIG. 3 illustrates a first gate 390 of a first transistor 410 and a second gate 290 of a second transistor 310, viewed from a side of a second surface of the semiconductor substrate. FIG. 5 is an enlarged diagram illustrating a part enclosed by a broken line in FIG. 2.

As illustrated in FIG. 1 to FIG. 3 and FIG. 5, the photoelectric conversion apparatus 500 includes a semiconductor substrate 2, a first fixed charge film 130, and a second fixed charge film 140. The semiconductor substrate 2 has a first surface to which light enters and a second surface facing the first surface. The semiconductor substrate 2 further has photoelectric conversion units 100 performing photoelectric conversion on the entering light and accumulating first electric charges of a first polarity, and first transistors 410 each having a first gate 390 on the second surface. A pixel area 10 has a plurality of pixels that is two-dimensionally arranged. Each of the pixels has the photoelectric conversion unit 100 and a pixel transistor. The pixel transistor is, for example, a transfer transistor, an amplification transistor, a reset transistor, or a selection transistor. The first transistors are a part or all of those transistors. The first transistors may be other publicly known transistors. Referring to FIG. 2, each of the first transistors 410 is a transfer transistor. A part of the photoelectric conversion units 100 functions as a source 400 of the transfer transistor. The source 400 is an N type semiconductor unit having an impurity concentration higher than the impurity concentration of the N type semiconductor unit included in PDs.

The semiconductor substrate 2 has the second transistors 310 each including the second gate 290 having a gate length shorter than that of the first gate 390. The term "gate length" refers to a distance from a drain side end to a source side end of a gate. The first fixed charge film 130 is continuously provided directly or with an insulating film in between in an area overlapping the photoelectric conversion units 100 and the second transistors 310 on the first surface of the semiconductor substrate 2. The first fixed charge film 130 has fixed charges of the first polarity. The second fixed charge film 140 is provided directly or with an insulating film in between on an upper surface of the first fixed charge film 130 at a position overlapping the second transistors 310 in a planer view. The second fixed charge film 140 has fixed charges of the second polarity.

According to this embodiment, the first transistors are included in the pixel area 10, and the second transistors are included in a peripheral circuit area 13. However, embodiments are not limited thereto, as will be described below. For example, effects of the aspect of the embodiments can be obtained even in a case where the first transistors and the second transistors are provided in the pixel area 10. The effects of the aspect of the embodiments can be obtained even in a case where the first transistors and the second transistors are provided in the peripheral circuit area 13.

The photoelectric conversion apparatus 500 can reduce malfunctions of the second transistors 310 and can reduce damages to the photoelectric conversion units 100 in manufacturing. These points will be described in detail below.

A photoelectric conversion apparatus of the related art has a film having negative fixed charges via a film having positive fixed charges in a peripheral circuit area. A manufacturing method for the photoelectric conversion apparatus first forms films having positive fixed charges on a semiconductor substrate at the peripheral circuit area and PDs. Next, the film having positive fixed charges provided on the upper surfaces of the PDs is etched for removal with leaving the film having positive fixed charges provided on the upper surface of the substrate at the peripheral circuit area. Next, a film having negative fixed charges is provided on the upper surface of the film having positive fixed charges left at the peripheral circuit area and upper surfaces of the PDs.

In the photoelectric conversion apparatus of the related art, there is a possibility that the PDs are damaged in the process of etching the film having positive fixed charges. In this case, there is a possibility that readout noise occurs in the PDs.

Accordingly, in the aspect of the embodiments, a film having negative fixed charges is continuously provided in areas overlapping the photoelectric conversion units 100 and the second transistors on the semiconductor substrate 2 and an area between them in the planer view, and a film having positive fixed charges is provided in an area overlapping the second transistors of the film having negative fixed charges. In other words, a film having negative fixed charges is provided in an area overlapping the photoelectric conversion units 100 and the second transistors 310 and an area between them, and a film having positive fixed charges is provided with the film having negative fixed charges so as to overlap the second transistors 310 and the film having negative fixed charges in the planer view. If the film having positive fixed charges is not provided, an electric field occurs between the semiconductor substrate 2 and the film having negative fixed charges. On the other hand, by providing the film having positive fixed charges, the electric field caused by the film having positive fixed charges and the electric field caused by the film having negative fixed charges cancel each other. Thus, the strength of the electric field from the film having negative fixed charges to the semiconductor substrate 2 decreases. Therefore, a hole accumulation layer due to the provided film having positive fixed charges cannot be easily generated. Furthermore, according to the aspect of the embodiments, the film having negative fixed charges can be provided on the first surface of the semiconductor substrate 2 with fewer variations of the film thickness. The film having negative fixed charges with an equal film thickness to those in the pixel area 10 and the peripheral circuit area 13 can be provided in the boundary portion between the pixel area 10 and the peripheral circuit area 13. This configuration can prevent malfunctions of the transistors particularly in the peripheral circuit area 13 in vicinity of the boundary between the pixel area 10 and the peripheral circuit area 13.

Main components of the photoelectric conversion apparatus 500 will be described below. The photoelectric conversion apparatus 500 is a back-side illumination type CMOS sensor.

Semiconductor Substrate 2

The semiconductor substrate 2 has a first surface to which light enters and a second surface facing the first surface. The semiconductor substrate 2 includes the photoelectric conversion unit 100 performing photoelectric conversion on the entering light and accumulating first electric charges and the first transistor 410 having the first gate 390 on the second surface. The semiconductor substrate 2 further includes the second transistor 310 having a second gate 290 having a gate length shorter than a gate length L1 of the first gate 390, as illustrated in FIG. 3, on the second surface. The first transistor 410 are NMOS transistors arranged in a well (P type well 360) having holes as majority carriers, for example.

In an inner part of the semiconductor substrate 2, a separation area 120 is provided between the first transistors 410 and the second transistors 310 in the planer view. This can prevent easy movement of electric charges between the first transistors 410 and the second transistors 310. The separation area 120 may be formed by an insulating material or polysilicon embedded within a trench provided in the semiconductor substrate 2 or by covering such a material with a silicon oxide film. The separation area 120 may be metal embedded within the trench. The separation area 120 is wider than a light shielding wall placed between pixels in the planer view. For example, the separation area 120 is more than twice as wide as the light shielding wall.

According to this embodiment, as illustrated in FIG. 1 and FIG. 2, the pixel area 10 is provided in which a plurality of the photoelectric conversion units 100 and a plurality of the first transistors 410 are two-dimensionally arranged. Each of the photoelectric conversion units 100 electrically connected to each of the plurality of the first transistors 410. A plurality of the second transistors 310 is provided outside the pixel area 10. Effects of the aspect of the embodiments can be obtained also in a case where the semiconductor substrate 2 includes one photoelectric conversion unit 100, one first transistor 410 and one second transistor 310.

Each of the photoelectric conversion units 100 is a PD, for example. More specifically, each of the photoelectric conversion units 100 includes an N type semiconductor portion being a part of the upper surface of the semiconductor substrate 2 and a P type semiconductor portion.

As illustrated in FIG. 2, the pixel area 10 has an effective pixel area 11 including the plurality of photoelectric conversion units 100 and a light-shielded OB (Optical Black) area 12. In the effective pixel area 11, a light shielding wall may be provided such that each pixel is separated with the light shielding wall. Thus, color mixture between pixels can be reduced. A plurality of pixels is repeatedly arranged in the pixel area 10. The part in which pixels are repeatedly arranged corresponds to the pixel area 10. The pixel area 10 has an area where light enters at predetermined periods, and this area corresponds to the effective pixel area 11. The OB area 12 has pixels repeatedly arranged in the same manner as in the effective pixel area 11 but is different from the effective pixel area 11 in that the OB area 12 is shielded from light. The peripheral circuit area 13 is provided outside the light shielded pixels and corresponds to an area where, in general, pixels are not repeatedly arranged as in the pixel area 10. Therefore, an area where the pixel repeatedly arranged structure ends corresponds to the boundary between the pixel area 10 and the peripheral circuit area 13.

According to this embodiment, the plurality of second transistors 310 is arranged in the area after the pixel-repeatedly-arranged structure ends in the planer view. In other words, the plurality of second transistors 310 is arranged in the peripheral circuit area 13. For example, the second transistors 310 may be provided outside an area where a plurality of lenses included in the microlens array 190 are two-dimensionally arranged in the planer view. In a case where the photoelectric conversion apparatus includes the separation area 120 as illustrated in FIG. 1, the plurality of second transistors 310 is provided in an area outside the separation area 120 in the planer view.

In addition to the points described above, the first transistors and the second transistors are different in the following points. For example, voltage is applied to the first transistors and the second transistors from different pad electrodes so that the second transistors 310 are not easily influenced by fluctuations of power source voltage (VDD) generated in the pixel area 10. The first transistors and first pad electrodes are connected to a first power supply line, and the second transistors and second pad electrodes are connected to a second power supply line. The power source voltage to be supplied to the first transistors is 3 V, for example, and the power source voltage to be supplied to the second transistors is approximately 2 V, for example.

In the peripheral circuit area 13, vertical scan circuits 230, horizontal scan circuits 240, a timing generator 250, and an output unit 260 are provided. A signal processing unit having a signal correcting unit and an analog/digital converting unit, for example, may be provided therein. The signal processing unit can be arranged between the pixel area 10 and the horizontal scan circuit 240. The second transistors are partial transistors or all transistors included in the configuration arranged in the peripheral circuit area 13. The transistors included in the configuration generally have a gate length shorter than those of the transistors included in the pixel area 10. In a case where the semiconductor substrate 2 includes transistors having a shorter gate length, the potential deviation has a large influence on the transistors. Therefore, the effect of the aspect of the embodiments becomes more significant.

Each of the second transistors 310 has the second gate 290 formed on the second surface of the semiconductor substrate 2. Referring to FIG. 2, NMOS transistors are included as the second transistors 310. In this case, each of the NMOS transistors has a source 280 and a drain 300 in the P type well 360. The well 360 having the source 280 and the drain 300 of each of the second transistors 310 is a part of the lower surface of the semiconductor substrate 2 and a part of the upper surface of the semiconductor substrate 2. For example, the well 360 is continuously provided from the first surface to the second surface of the semiconductor substrate 2.

The peripheral circuit area 13 may further include a PMOS transistor 350 having a source 320 and a drain 340 in an N type well 370 and a gate 330 on the second surface.

Referring to FIG. 2, the second transistor 310 may be a PMOS transistor provided in the well (N type well) having electrons as majority carriers. Also in a case where the second transistors 310 are PMOS transistors, there is a possibility that the potential deviation occurs, as will be described below.

FIG. 3 illustrates the first gate 390 of the first transistor 410 and the second gate 290 of the second transistor 310 when the semiconductor substrate 2 is viewed from the second surface side. As illustrated in FIG. 3, the second gate 290 has a gate length L2 shorter than a gate length L1 of the first gate 390. Because this can reduce the parasitic capacitance of the second transistor 310, the second transistor 310 can be driven quickly. The second gate 290 has a gate width W2 narrower than a gate width W1 of the first gate 390, and the area of the second gate 290 of the second transistor 310 is smaller than the area of the first gate 390 of the first transistor 410. Thus, the power source voltage that drives the second transistor 310 is lower than the power source voltage that drives the first transistor 410. The expression "power source voltage that drives" refers to voltage to be supplied to one or all of a gate, a source, and a drain. With a lower power source voltage, even a small potential deviation causes a malfunction. Therefore, the second transistor 310 more easily causes transistor malfunction due to a potential deviation, compared with the first transistor 410. The term "gate width" refers to a length of a gate in a direction orthogonal to the gate length.

As the semiconductor substrate 2, an Si substrate can be used, for example.

Figure 4:
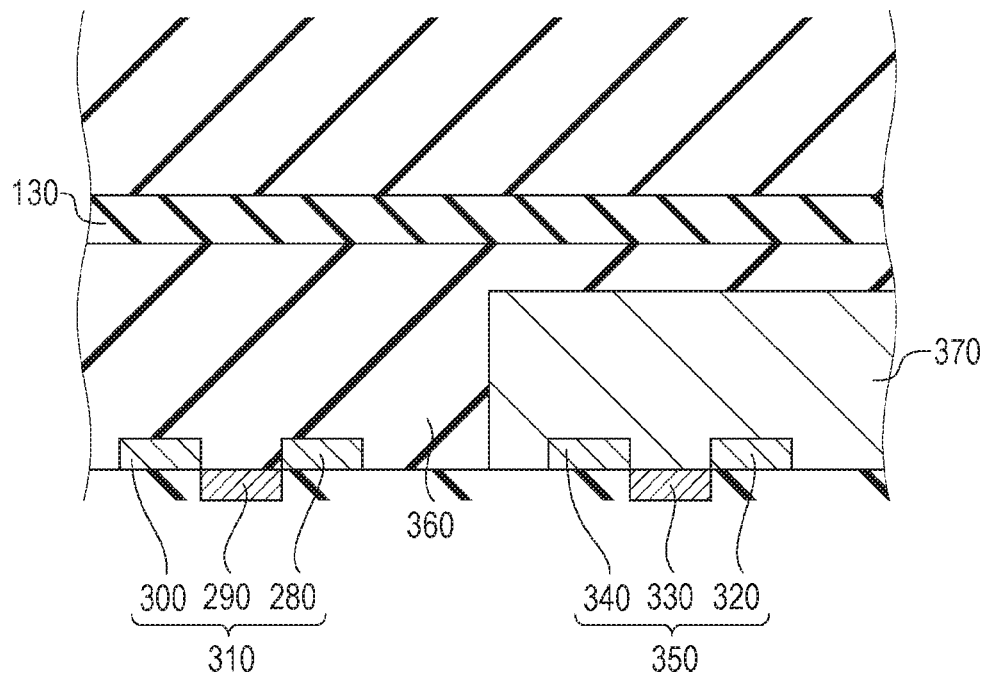
FIG. 4 is a diagram for explaining a mechanism of occurrence of a potential difference caused in the second transistors.

With reference to FIG. 4, a mechanism of occurrence of a potential deviation causing a malfunction of the second transistor 310 will be described. FIG. 4 is a reference diagram for explaining the potential deviation occurrence mechanism, and the second fixed charge film 140 is not provided on the upper surface of the first fixed charge film 130. FIG. 4 is an enlarged view of the two transistors 310 and 350 of different conductivity types and their vicinity. The first fixed charge film 130 having fixed charges of a negative polarity is provided on the first surface of the semiconductor substrate 2.

First, a case where the second transistor 310 is a PMOS transistor will be described. In this case, the source 280 and the drain 300 of the PMOS transistor 310 are provided in an N type well 360. A P type well 370 is further provided in the N type well 360, and the source 320 and the drain 340 of the NMOS transistor 350 are provided in the P type well 370. When the first fixed charge film 130 is provided and an electric field occurs from the film having fixed charges, a hole accumulation layer in which holes are accumulated is formed in the N type well 360 in vicinity of the first fixed charge film 130. When the hole accumulation layer is formed, a depletion layer is formed between the hole accumulation layer and the N type well 360, and there is a possibility that the electric potential in the N type well 360 is deviated from a predetermined electric potential. Because of an influence of the potential deviation, the threshold voltage of the PMOS transistor 310 changes, which may possibly cause a malfunction of the PMOS transistor 310.

Next, a case where the second transistor 310 is an NMOS transistor will be described. In this case, the source 280 and the drain 300 of the NMOS transistor 310 is provided in the P type well 360. An N type well 370 is further provided in a P type well 360, and the source 320 and the drain 340 of the PMOS transistor 350 are provided in the N type well 370. When the first fixed charge film 130 is provided and an electric field occurs from the film having fixed charges, a hole accumulation layer in which holes are accumulated is formed in the P type well 360 in vicinity of the first fixed charge film 130. In a case where the distance between the first fixed charge film 130 and the source 280 and the drain 300 included in the NMOS transistor 310 is short and when a hole accumulation layer is formed, there is a possibility that the impurity concentration of the P type well 360 in vicinity of the source 280 and the drain 300 decreases. In this case, the width of the depletion layer between the source 280 and drain 300 and the P type well 360 increases. The increased width of the depletion layer causes the threshold of the driving voltage of the NMOS transistor 310 to be lower than a designed value, which may possibly cause a malfunction of the NMOS transistor 300.

Against them, as illustrated in FIG. 5, the film 140 having positive fixed charges is provided on the upper surface of the film 130 having negative fixed charges at a position overlapping the second transistor 310 in the planer view so that the formation of a hole accumulation layer can be reduced. Thus, the depleting in the well having the second transistor 310 can be easily reduced, and a malfunction due to the potential deviation of the back gate from a set value or fluctuations of the threshold voltage of the transistor can be reduced. Therefore, a malfunction of the second transistor 310 can be easily reduced.

Although FIG. 5 illustrates that a well is provided in a well of different conductivity type, an N type well and a P type well are provided with an insulating portion in between. For example, an N type well having a source and a drain of a PMOS transistor is continuously provided from the lower surface to the upper surface of the semiconductor substrate. Also, a P type well having a source and a drain of a NMOS transistor is continuously provided from the lower surface to the upper surface. An insulating portion is provided between the N type well and the P type well. Also in this case, the effect of the aspect of the embodiments can be obtained.

First Fixed Charge Film 130

The first fixed charge film 130 is a film having fixed charges of the first polarity and is provided on the first surface of the semiconductor substrate 2 in an area overlapping at least the photoelectric conversion units 100 and the second transistors 310 in the planer view. In other words, the first fixed charge film 130 is provided such that the first fixed charge film 130 overlaps at least the photoelectric conversion units 100 and the second transistors in the planer view on the upper surface of the semiconductor substrate 2. The term "fixed charges" herein refers to electric charges being present in a film and being fixed without moving due to an electric field, for example.

According to this embodiment, the first fixed charge film 130 is provided such that the first fixed charge film 130 continuously covers an area just above the plurality of photoelectric conversion units 100, the plurality of first transistors 410, and the plurality of second transistors 310 on the first surface of the semiconductor substrate 2. In other words, in the planer view, the first fixed charge film 130 is continuously provided such that the first fixed charge film 130 overlaps the plurality of photoelectric conversion units 100, the plurality of first transistors, and the plurality of second transistors. The first fixed charge film 130 may be provided in all of the pixel area 10 and peripheral circuit area 13 on the upper surface of the semiconductor substrate 2, for example. Because this eliminates necessity for removal of the first fixed charge film 130 by etching, for example, damaging the semiconductor substrate 2 can be inhibited.

The first fixed charge film 130 may be partially provided because it is important that the first fixed charge film 130 is provided on the first surface of the semiconductor substrate in an area overlapping the photoelectric conversion units 100 and second transistors 310 in the planer view. Also in this case, the effect relating to the potential deviation can be obtained to some extent. The first fixed charge film 130 may be entirely provided on the first surface in the pixel area and the peripheral circuit area.

The first fixed charge film 130 may contain at least one of hafnium oxide, aluminum oxide, and tantalum oxide, for example. Because these materials have high transmission rates to visible light to some extent, reduction of the amount of light to be received by the photoelectric conversion units 100 can easily be prevented. The first fixed charge film 130 may be formed by stacking layers formed of those materials, may be a monolayer formed of one of those materials or may be formed by stacking a layer formed of one of those materials a plurality of number of times. The first fixed charge film 130 may be formed by stacking aluminum oxide and tantalum oxide in order from the semiconductor substrate 2 side, for example.

The first fixed charge film 130 may be formed by stacking a plurality of layers having different refractive indices. According to this embodiment, the first fixed charge film 130 is formed by stacking a layer having a first refractive index lower than the refractive index of the semiconductor substrate 2 and a layer having a second refractive index lower than the first refractive index in order from the semiconductor substrate 2 side. This enables light to efficiently enter to the photoelectric conversion unit 100 because total reflection of the light by the first fixed charge film 130 can be reduced.

In the area overlapping the photoelectric conversion units 100 in the planer view, the first fixed charge film 130 may have a thickness in a range equal to or greater than 3 nm and equal to or less than 100 nm. The thickness equal to or greater than 3 nm allows easy reduction of dark current, and the thickness equal to or less than 100 nm allows reduction of an increase in vertical size of the photoelectric conversion apparatus.

FIG. 2 illustrates the first fixed charge film 130 directly in contact with the upper surfaces of the photoelectric conversion units 100. However, a layer may be interposed between the first fixed charge film 130 and the upper surfaces of the photoelectric conversion units 100 to an extent that the layer does not substantially have an influence on the hole accumulation. For example, the first fixed charge film 130 may be provided on the upper surfaces of the photoelectric conversion unit 100 via an insulating film that is a layer having an interface state lower than the interface state of the semiconductor substrate 2 and the first fixed charge film 130 and lowering the interface state of the semiconductor substrate 2 and the first fixed charge film 130. The insulating film contains silicon oxide, for example. The insulating film has a film thickness in a range equal to or greater than one atomic layer and equal to or less than 100 nm, for example.

Second Fixed Charge Film 140

The second fixed charge film 140 is provided on the upper surface of the first fixed charge film 130 in an area overlapping the second transistors 310 in the planer view. This can easily reduce a malfunction of the second transistors 310. According to this embodiment, as illustrated in FIG. 2, the second fixed charge film 140 is also provided on the upper surface of the first fixed charge film 130 in an area overlapping the PMOS transistor 350 in the planer view. The second fixed charge film 140 may be provided at a position overlapping the second transistors 310 in the planer view.

The second fixed charge film 140 may be provided directly in contact with the upper surface of the first fixed charge film 130 so that an influence of the electric field for carriers included in the film having negative fixed charges can easily be prevented. An insulating film may be provided between the first fixed charge film 130 and the second fixed charge film 140 to an extent that an influence of electric field for carriers due to the provided second fixed charge film 140 can be reduced. The insulating film contains silicon oxide, for example. The insulating film has a film thickness in a range equal to or greater than one atomic layer and equal to or less than 100 nm, for example.

The second fixed charge film 140 is a silicon nitride film formed at a low temperature, for example. The term "low temperature" herein refers to a temperature in a range equal to or higher than 100° C. to equal to or lower than 450° C. The second fixed charge film 140 can contain at least one of silicon oxide and silicon nitride formed at a low temperature, for example. Between them, the second fixed charge film 140 can contain silicon nitride having a fixed charge density higher than that of silicon oxide. Particularly, the ALD method or the CVD method may be applied as a method for forming a film of silicon oxide or silicon nitride at a low temperature. According to the ALD method, typically, a film of silicon oxide or silicon nitride can be formed at 100 to 400° C. According to the CVD method, typically, a film of silicon oxide or silicon nitride can be formed at 300° C. to 500° C. A silicon oxide film may be formed at a temperature equal to or lower than 400° C. to have positive fixed charges.

A silicon oxide film having an O/Si equal to or higher than 1.50 and equal to or lower than 1.85 can be used as the film having positive fixed charges. In this case, the O/Si is a ratio of O atoms to Si atoms in silicon oxide. An ideal stoichiometric mixture ratio of the silicon oxide is an O/Si of 2. In order to acquire silicon oxide lacking O atoms against the ideal stoichiometric mixture ratio, the ALD method or the CVD method (including a plasma CVD method and an MOCVD method) is used, for example. When applying one of these methods, the partial pressure of gas formed by mixing oxygen and other gas (such as hydrogen and argon) may be adjusted in forming the film of silicon oxide. Thus, a silicon oxide film lacking O atoms against O/Si=2 that is an ideal stoichiometric mixture ratio of silicon oxide can be acquired. Then, the silicon oxide can contain positive fixed charges. The film having positive fixed charges may be silicon oxynitride (SiON) film. The film having positive fixed charges may be formed by stacking silicon oxide and silicon nitride.

The second fixed charge film 140 may have charges and a film thickness to an extent that a carrier accumulation layer is not formed under the first fixed charge film 130. For example, in the area where the second transistors, the first fixed charge film 130 and the second fixed charge film 140 overlap in the planer view, the second fixed charge film 140 may have a thickness greater than the thickness of the first fixed charge film 130. Thus, the formation of the carrier accumulation layer due to the first fixed charge film 130 can be easily reduced in the well having the source and drain areas of the second transistors.

Insulating Portion

An insulating portion is provided on the upper surface of the first fixed charge film 130 and the upper surface of the second fixed charge film 140. The insulating portion includes a first insulating unit 150, a light shielding film 160, and a second insulating unit 170. The first insulating unit 150 is provided on the upper surface of the first fixed charge film 130 and the upper surface of the second fixed charge film 140. The light shielding film 160 is provided on the upper surface of the first insulating unit 150. The second insulating unit 170 is provided on the upper surfaces of the first insulating unit 150 and the light shielding film 160. The insulating portion may have a flat upper surface. Thus, a color filter 180 and a microlens array 190 may be easily placed thereon. The insulating portion may include the light shielding film 160 outside at least the plurality of photoelectric conversion units 100 in the planer view. This can reduce fluctuations of the characteristics of the second transistors 310 because of light entering thereto. The light shielding film 160 is provided in the OB area 12 included in the pixel area 10. The light shielding film 160 may contain, for example, metal having a light blocking effect such as tungsten.

Color Filter 180 and Microlens Array 190

The color filter 180 and the microlens array 190 in order from the bottom are provided on the upper surface of the insulating portion in an area corresponding to the plurality of photoelectric conversion units 100. In other words, the microlens array 190 is provided on the first surface side of the semiconductor substrate 2. The color filter 180 and the microlens array 190 may contain a publicly known material.

Wiring Portion 220

A wiring portion 220 is provided on the second surface side of the semiconductor substrate 2. The wiring portion 220 has a plurality of wiring layers 200 and a third insulating portion 210 that insulates between the plurality of wiring layers 200. The wiring layers 200 are electrically connected to the photoelectric conversion units 100 and the transistors. The wiring layer 200 may contain aluminum, copper and so on, and the third insulating portion 210 may contain silicon oxide. The number of wiring layers connected to the second transistor 310 is larger than the number of wiring layers connected to the first transistors 410.

Supporting Substrate 3

A supporting substrate 3 is provided on the opposite side of the side the semiconductor substrate 2 provided thereon of the wiring portion 220 (lower surface side of the wiring portion 220) to reinforce the strength of the semiconductor substrate 2. The supporting substrate 3 may be a silicon substrate, for example. The supporting substrate 3 and the wiring portion 220 can be bonded by plasma activation bonding, for example.

Manufacturing Method

FIG. 6A to FIG. 6E illustrate a manufacturing method for the photoelectric conversion apparatus 500 according to this embodiment.

Preparing Semiconductor Substrate 2

Figure 6A:
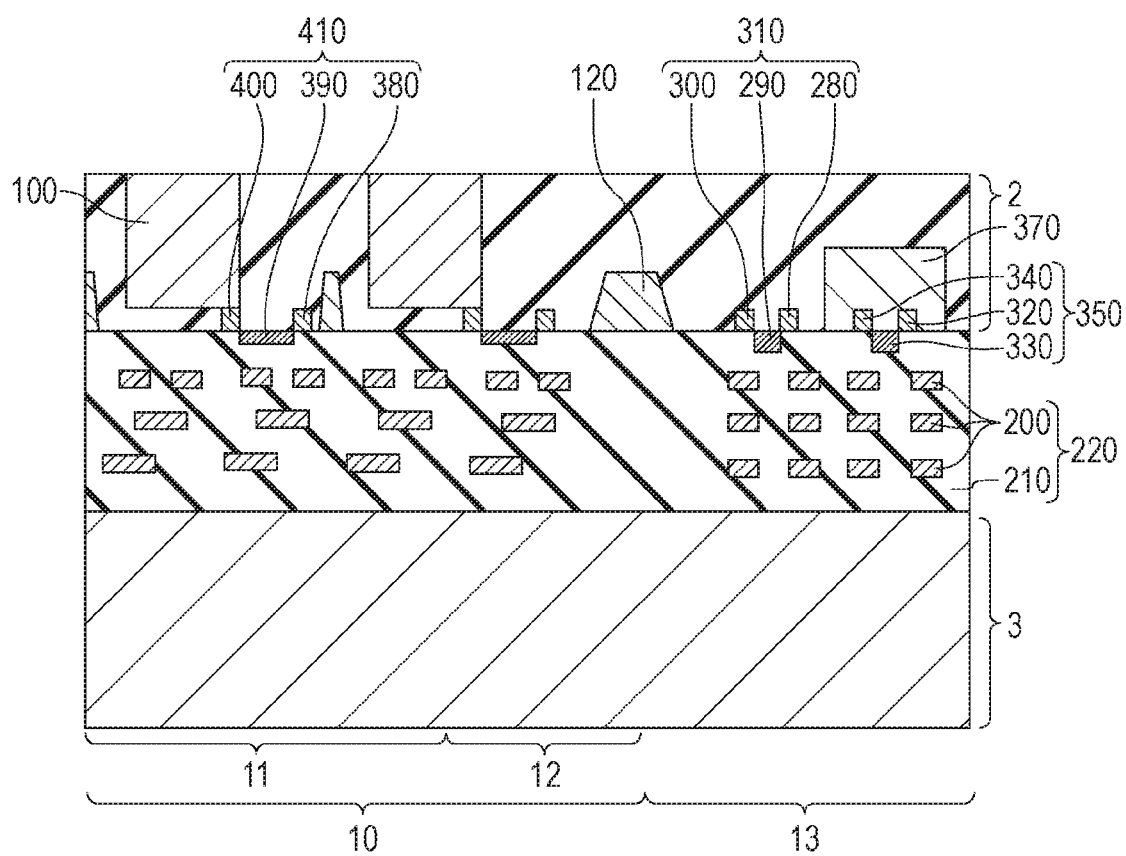
FIG. 6A is a diagram for explaining a manufacturing method for the photoelectric conversion apparatus according to the first embodiment of the disclosure.

First, as illustrated in FIG. 6A, the semiconductor substrate 2 is prepared. The semiconductor substrate 2 at least has the photoelectric conversion unit 100, the first transistor 410, and the second transistor 310. The semiconductor substrate 2 may include other components as described above.

Forming First Film

Figure 6B:
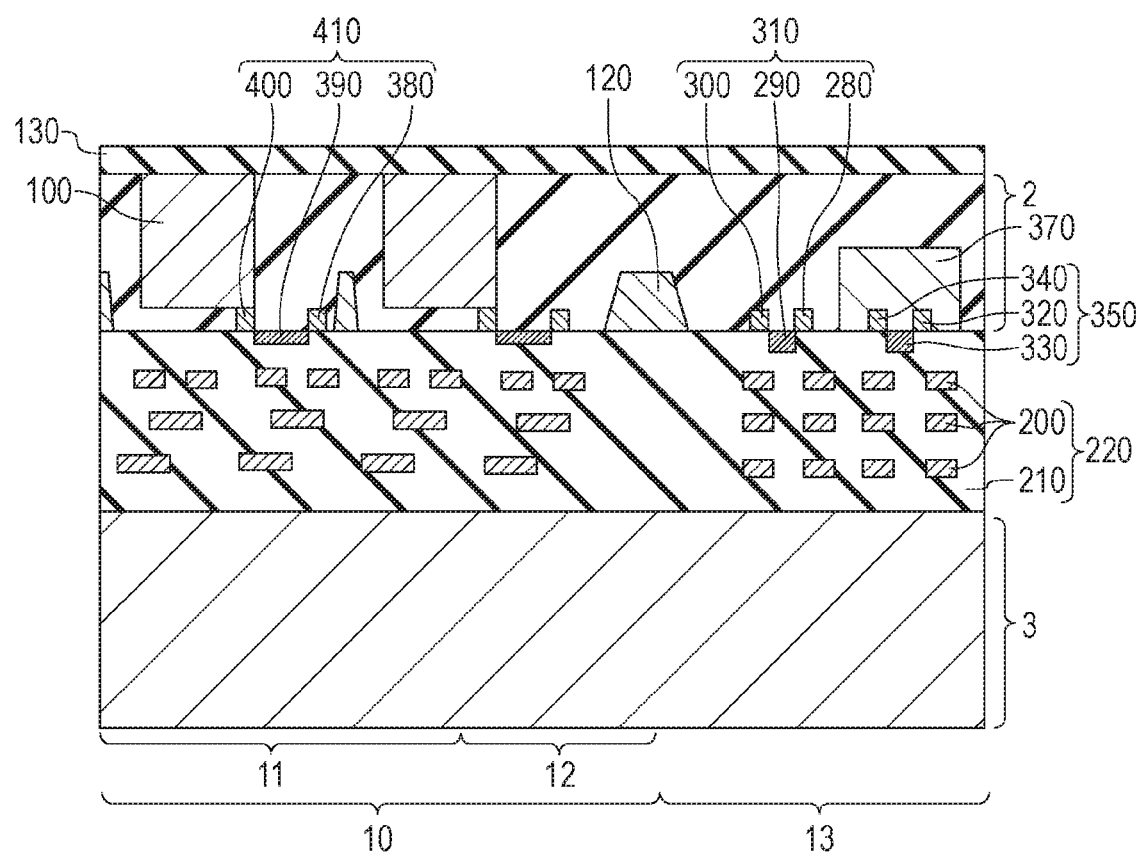
FIG. 6B is a diagram for explaining the manufacturing method for the photoelectric conversion apparatus according to the first embodiment of the disclosure.

Next, as illustrated in FIG. 6B, the first film 130 is formed in an area overlapping the photoelectric conversion units 100 and the second transistor 310 in the planer view. The first film may contain at least one of hafnium oxide, aluminum oxide, and tantalum oxide. As illustrated in FIG. 6B, the first film 130 is continuously formed in an area overlapping the photoelectric conversion units 100 to the second transistor 310 in the planer view.

The first film 130 may be formed by using the sputtering method, the CVD method, the ALD method and so on. These methods may be combined. For example, one layer of aluminum oxide having a thickness of 20 nm or less may be formed by the ALD method. Then, for increased productivity, a layer of tantalum oxide having a thickness of 50 to 100 nm may be formed by the sputtering method.

Forming Second Film

Figure 6C:
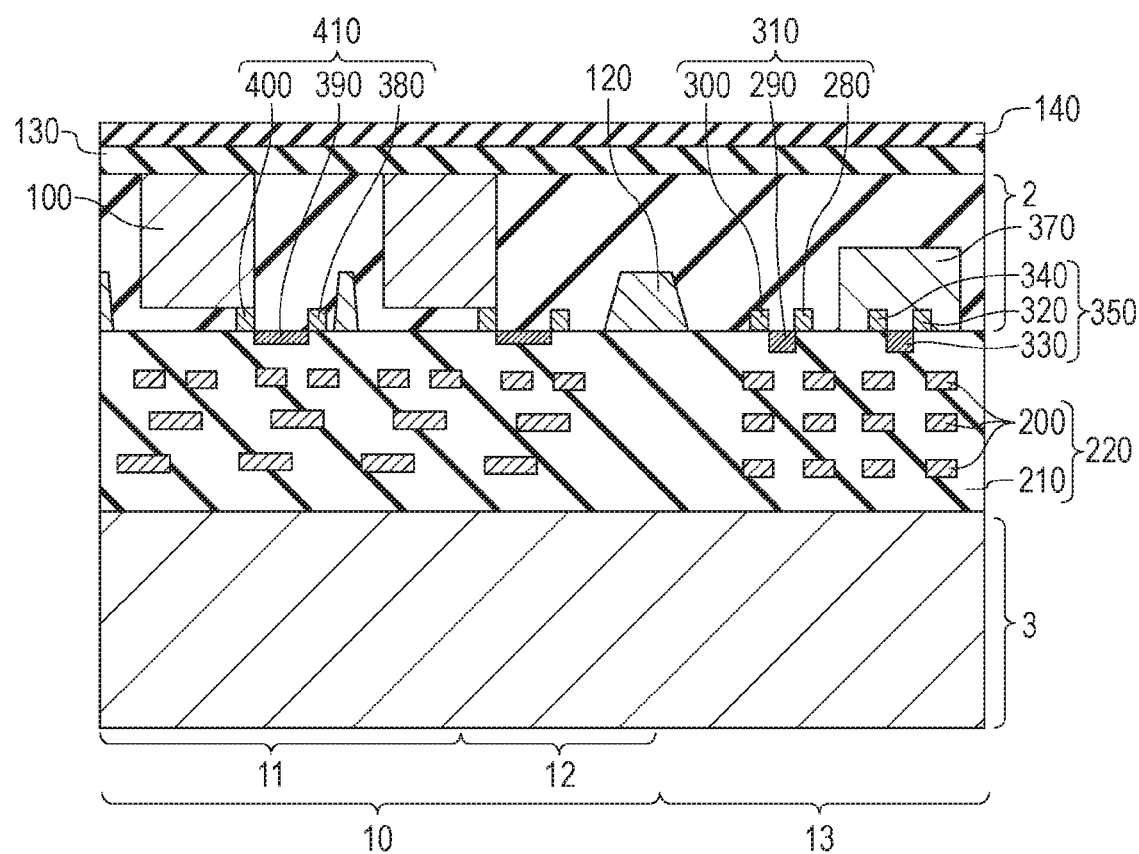
FIG. 6C is a diagram for explaining the manufacturing method for the photoelectric conversion apparatus according to the first embodiment of the disclosure.

Next, as illustrated in FIG. 6C, the second film 140 is formed in an area overlapping the photoelectric conversion units and the second transistor on the first film 130. The second film contains at least one of silicon oxide and silicon nitride having an O/Si ratio in a range equal to or higher than 1.50 and equal to or lower than 1.85. The second film 140 may be formed by the ALD method, the CVD method and so on.

Removing Part of Second Film while Leaving First Film

Figure 6D:
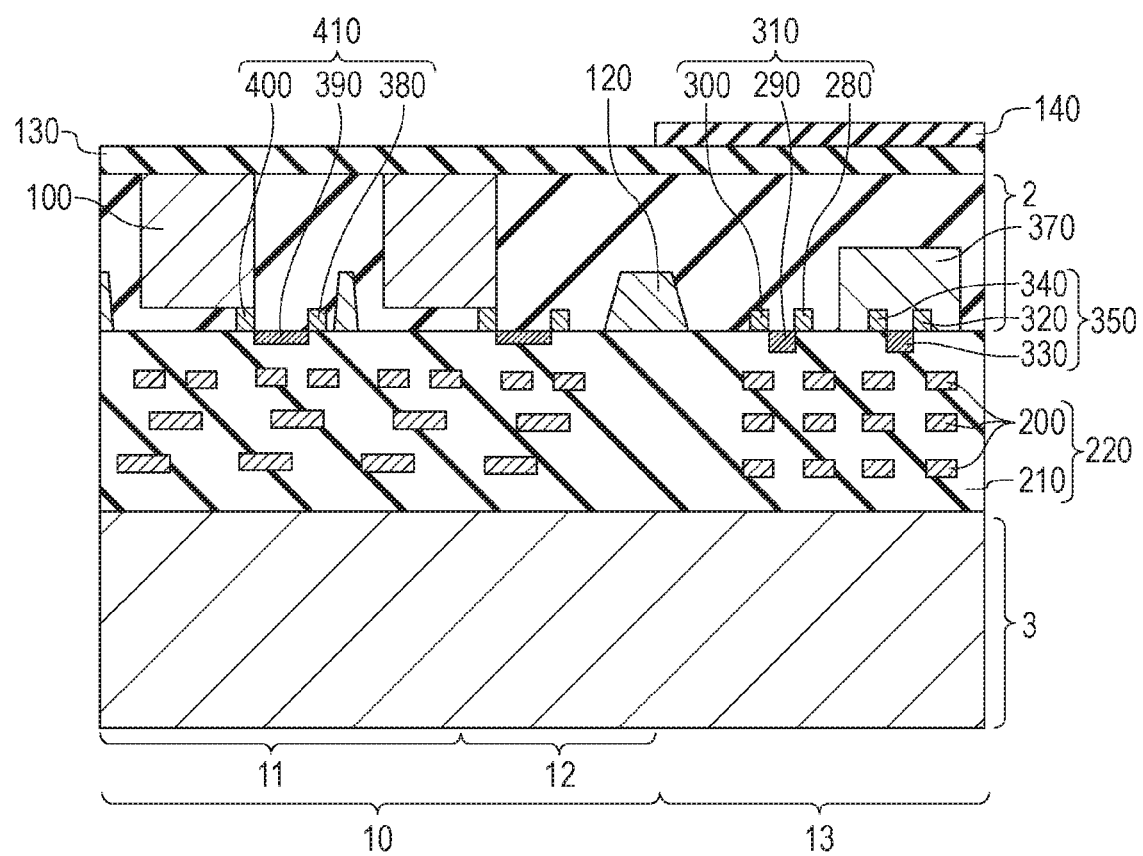
FIG. 6D is a diagram for explaining the manufacturing method for the photoelectric conversion apparatus according to the first embodiment of the disclosure.
Figure 6E:
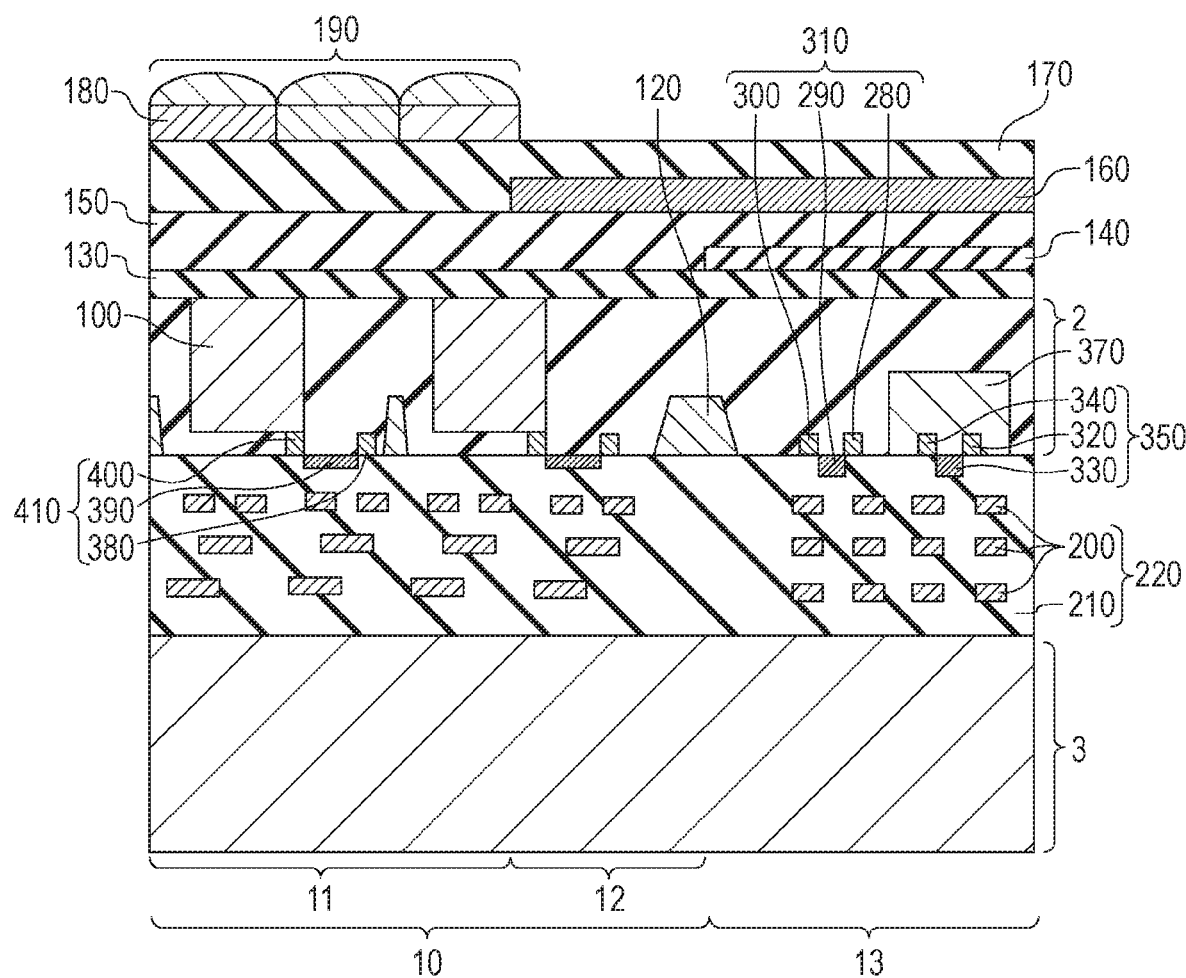
FIG. 6E is a diagram for explaining the manufacturing method for the photoelectric conversion apparatus according to the first embodiment of the disclosure.

Next, as illustrated in FIG. 6D, the second film 140 is removed while leaving the first film 130 in the area overlapping the photoelectric conversion units 100 in the planer view. In this case, the first film 130 and the second film 140 are left in the area overlapping the second transistor 310 in the planer view. For example, the second film 140 is removed by coating resist, patterning it by lithography and performing dry etching thereon in the area overlapping the second transistor 310 in the planer view. In other words, a part of the second film 140 is removed while leaving the first film 130. This can reduce damaging the semiconductor substrate 2 by the etching.

Microlens Array or the Like

Next, the insulating portion is provided on the upper surfaces of the first film 130 and the second film 140. The insulating portion is manufactured as follows, for example. The first insulating unit 150 is formed on the upper surface of the first film 130 and the upper surface of the second film 140. Because the upper surface of the first insulating unit 150 has a difference in the level due to the second film 140, the upper surface of the first insulating unit 150 is flattened by clearing the difference in the level by the CMP method. After that, the light shielding film 160 is provided on the upper surface of the first insulating unit 150. Next, an area to which light does not enter is patterned in the peripheral circuit area 13 and the OB area 12 by resist coating and photolithography, and the light shielding film 160 is left. Next, the second insulating unit 170 is provided on the upper surfaces of the first insulating unit 150 and the light shielding film 160, and the upper surface of the second insulating unit 170 is flattened by the CMP method to clear the difference in the level due to the light shielding film 160. Next, the color filter 180 is provided on the upper surface of the second insulating unit 170. Next, the microlens array 190 is provided on the upper surface of the color filter 180.

Second Embodiment

Figure 7:
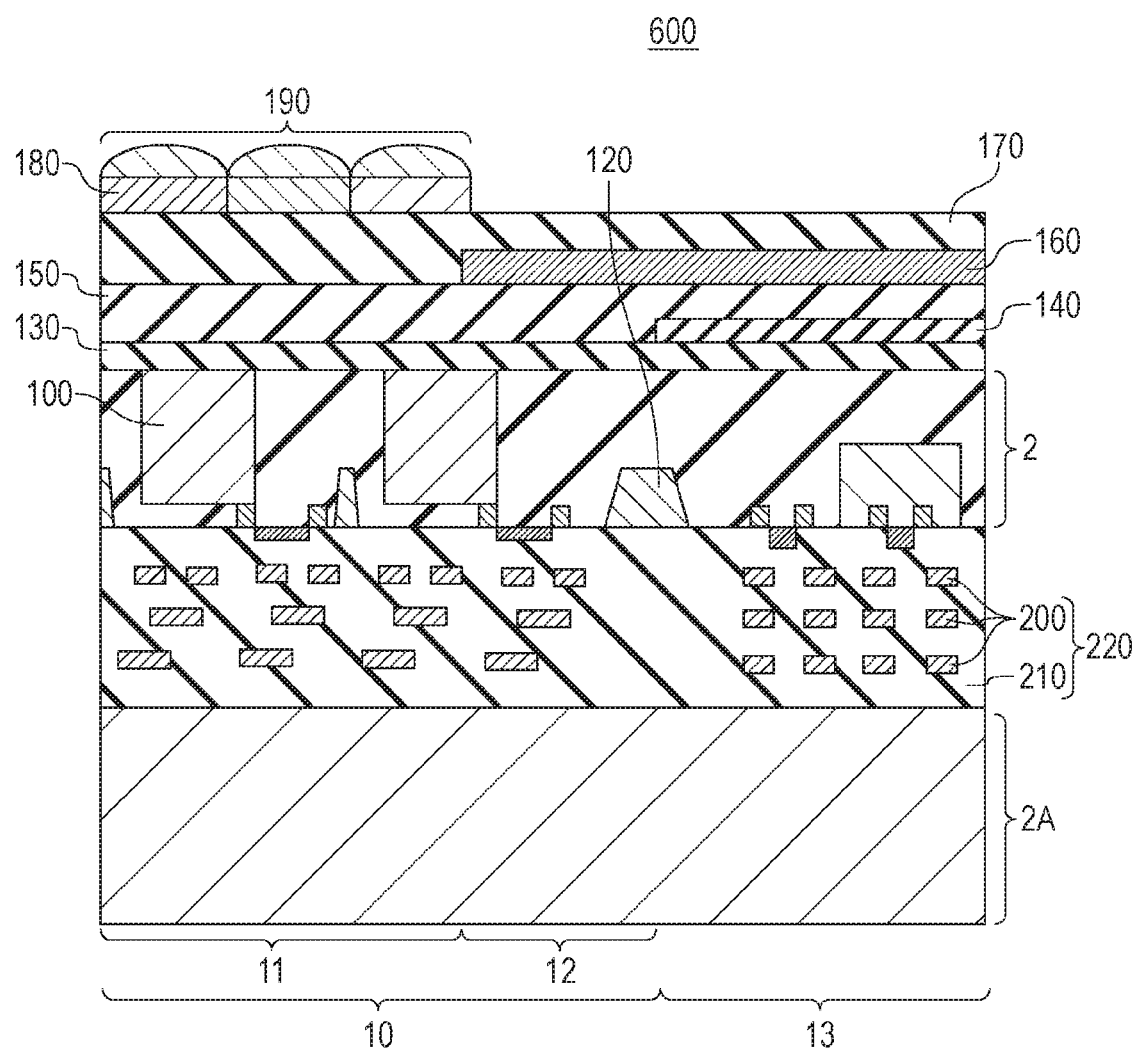
FIG. 7 is a schematic sectional view of a photoelectric conversion apparatus according to a second embodiment of the disclosure.
Figure 8:
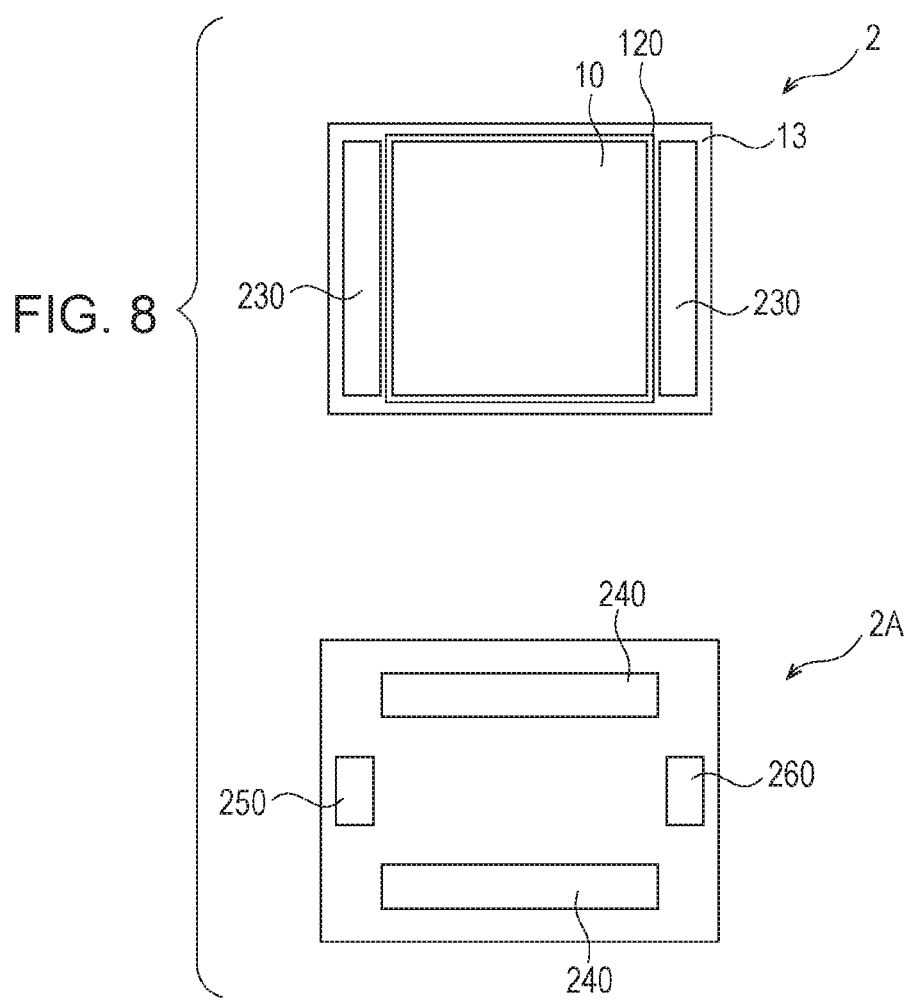
FIG. 8 is a schematic top view of a semiconductor substrate and a schematic top view of a second semiconductor substrate included in the photoelectric conversion apparatus according to the second embodiment of the disclosure.

FIG. 7 illustrates a sectional view of a photoelectric conversion apparatus 600 according to a second embodiment. FIG. 8 illustrates plan views of a semiconductor substrate 2 and a second semiconductor substrate 2A included in the photoelectric conversion apparatus 600. The photoelectric conversion apparatus 600 is substantially the same as the matters according to the first embodiment except for the components included in the semiconductor substrate 2 and use of the second semiconductor substrate 2A instead of the supporting substrate 3.

In the photoelectric conversion apparatus 600, as illustrated in FIG. 8, the semiconductor substrate 2 includes a plurality of the photoelectric conversion units 100, a plurality of the first transistors, and vertical scan circuits 230. The second semiconductor substrate 2A includes horizontal scan circuits 240, a timing generator 250, and an output unit 260. As illustrated in FIG. 7, the second semiconductor substrate 2A is bonded to the lower surface of the wiring portion 220.

According to this embodiment, because the horizontal scan circuits 240 and so on may not be provided in the semiconductor substrate 2, the constraint of the size of the pixel area 10 can be weakened. Because the semiconductor substrate 2 can be supported by the second semiconductor substrate 2A, the supporting substrate 3 may not further be provided. Therefore, the area of the pixel area 10 can be increased while reducing an increase of the thickness of the photoelectric conversion apparatus.

The second semiconductor substrate 2A may be an Si substrate, for example.

Third Embodiment

Figure 9:
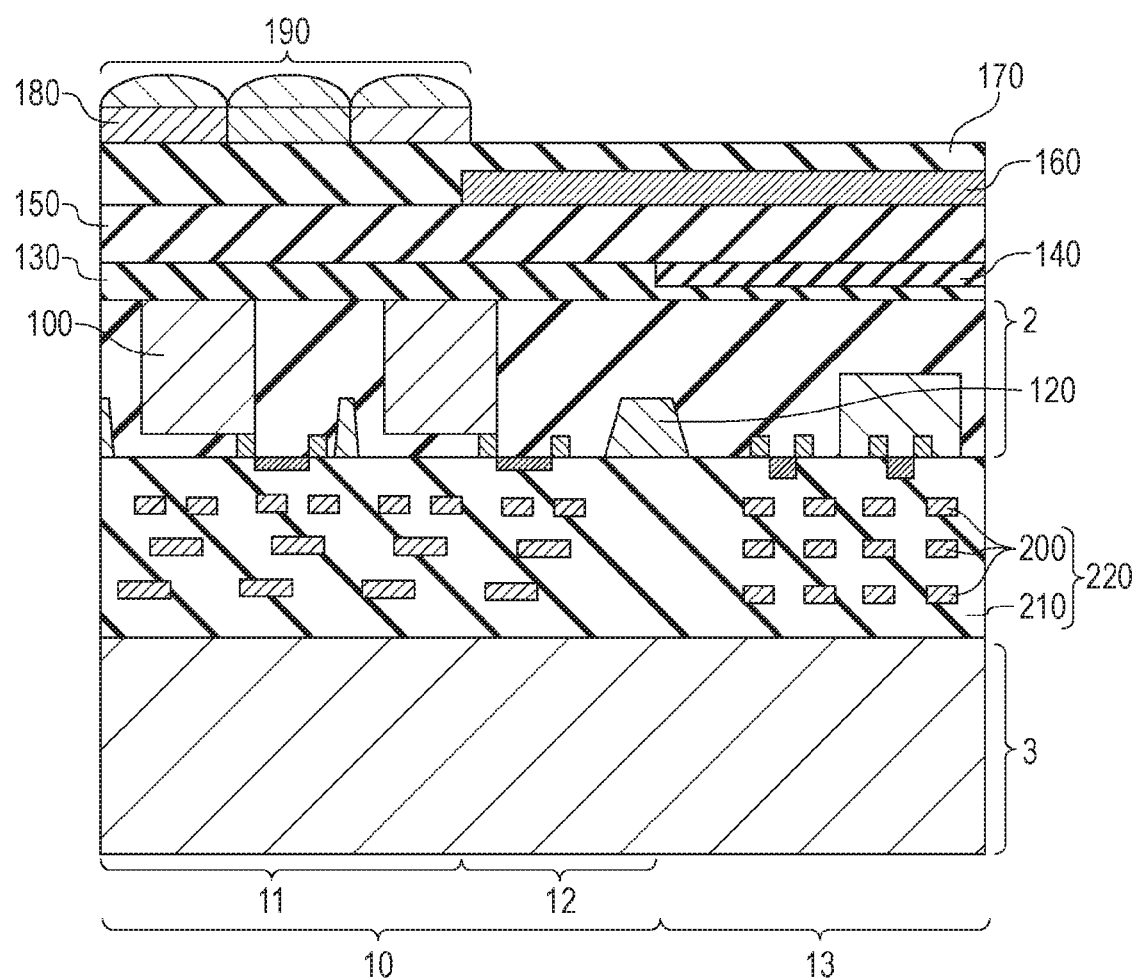
FIG. 9 is a schematic sectional view of a photoelectric conversion apparatus according to a third embodiment of the disclosure.

FIG. 9 is a schematic sectional view of a photoelectric conversion apparatus 700 according to a third embodiment. The photoelectric conversion apparatus 700 is substantially the same as the matters according to the first embodiment except that the first fixed charge film 130 at a position overlapping the photoelectric conversion units 100 in the planer view is thick.

In the photoelectric conversion apparatus 700, the height from the first surface to the upper surface of the first fixed charge film 130 at the position overlapping the photoelectric conversion units 100 in the planer view is equal to the height from the first surface to the upper surface of the second fixed charge film 140 at the position overlapping the second transistors in the planer view. For example, the thickness of the first fixed charge film 130 at the position overlapping the second transistors is less than the thickness of the first fixed charge film 130 at the position overlapping the photoelectric conversion units 100. The second fixed charge film 140 is provided on the upper surface of the thinner part of the first fixed charge film 130. The first fixed charge film 130 is thinner at the position overlapping the second transistors 310 where occurrence of a hole accumulation layer is to be reduced.

This embodiment can inhibit occurrence of a hole accumulation layer in the well 360 having the sources 280 and drains 300 of the second transistors 310. According to this embodiment, the second semiconductor substrate 2A may be used instead of the supporting substrate 3, like the photoelectric conversion apparatus 600.

Fourth Embodiment

Figure 10:
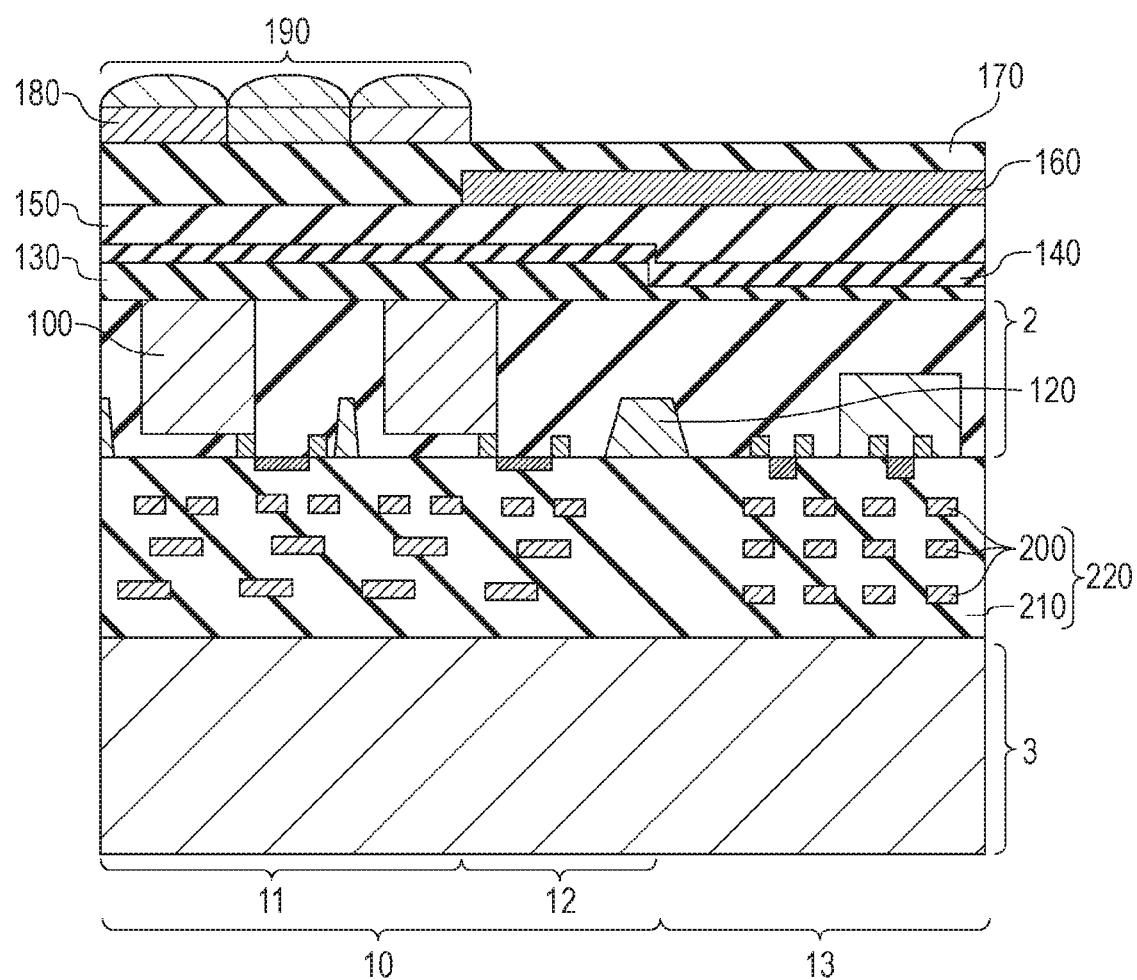
FIG. 10 is a schematic sectional view of a photoelectric conversion apparatus according to a fourth embodiment of the disclosure.

FIG. 10 illustrates a schematic sectional view of a photoelectric conversion apparatus 800 according to a fourth embodiment. The photoelectric conversion apparatus 800 is substantially the same as the matters according to the third embodiment except that the second fixed charge film 140 is provided on the upper surface of the first fixed charge film 130 provided at the position overlapping the photoelectric conversion units 100 in the planer view.

The thickness of the first fixed charge film 130 provided at the position overlapping the photoelectric conversion units 100 is greater than the thickness of the first fixed charge film 130 provided at the position overlapping the second transistors. The second fixed charge film 140 is provided on the upper surface of the first fixed charge film 130 provided at the position overlapping the plurality of photoelectric conversion units 100.

This embodiment eliminates the necessity for performing the operation for removing by etching the second fixed charge film 140 provided at the position overlapping the photoelectric conversion units 100. Therefore, the time for manufacturing the photoelectric conversion apparatus can be reduced, compared with a manufacturing method including the removal by etching.

Fifth Embodiment

Figure 11:
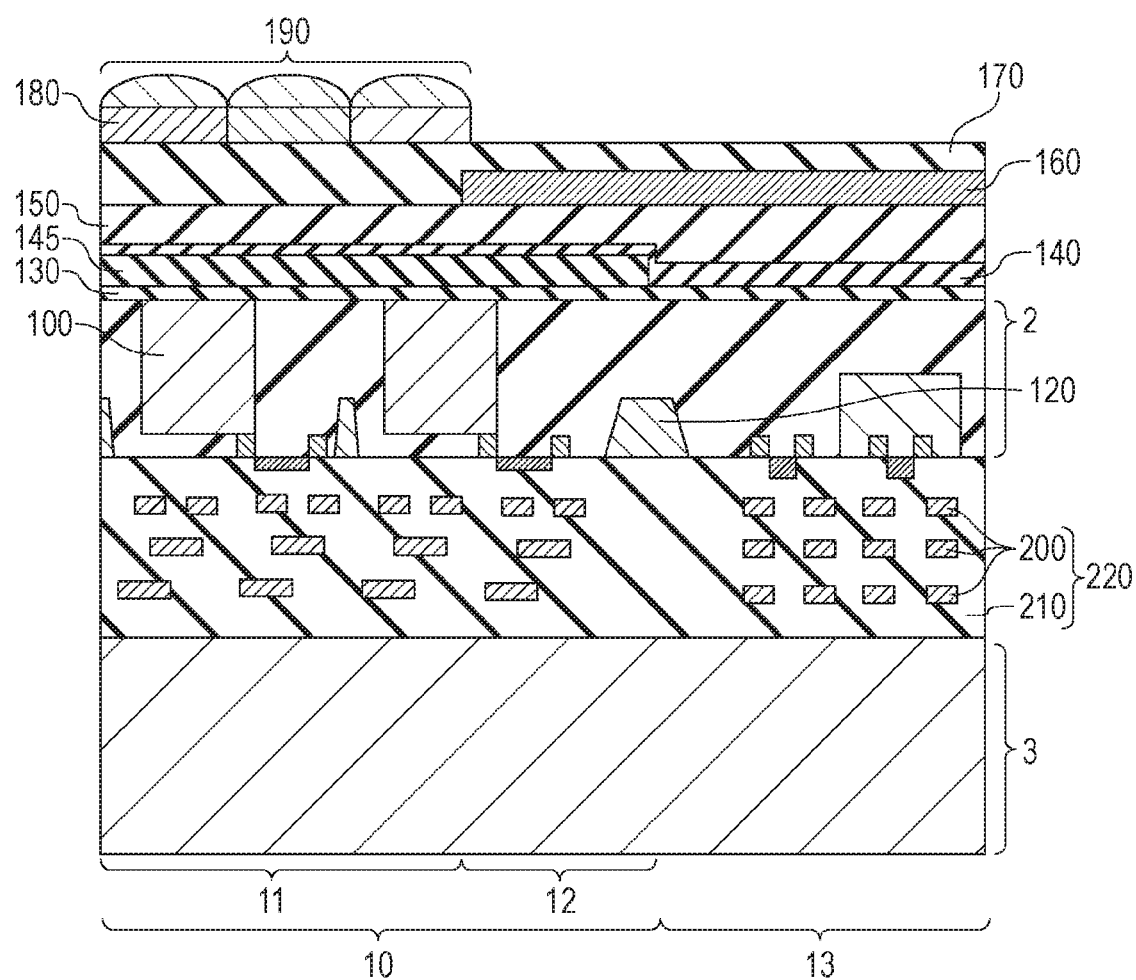
FIG. 11 is a schematic sectional view of a photoelectric conversion apparatus according to a fifth embodiment of the disclosure.

FIG. 11 illustrates a schematic sectional view of a photoelectric conversion apparatus 900 according to a fifth embodiment. In the photoelectric conversion apparatus 900, at a position overlapping the photoelectric conversion units 100, the first fixed charge film 130 is thinner, and the second fixed charge film 140 is provided on the upper surface of the first fixed charge film 130 with a fourth insulating unit 145 in between. Except for that, this embodiment is substantially the same as the matters according to the third embodiment.

In the photoelectric conversion apparatus 900, the fourth insulating unit 145 is provided on the upper surface of the first fixed charge film 130 provided at a position overlapping the photoelectric conversion units 100. The second fixed charge film 140 is provided on the upper surface of the fourth insulating unit 145 and the upper surface of the first fixed charge film 130 immediately above the second transistors. The fourth insulating unit 145 has a thickness enough for causing a carrier accumulation layer at a position having the first fixed charge film 130 on the first surface of the semiconductor substrate. For example, the fourth insulating unit 145 has a thickness twice the thickness of the first fixed charge film 130 provided at the position overlapping the second transistors.

This embodiment eliminates the necessity for the removal of the second fixed charge film 140 while causing the first fixed charge film 130 provided at the position overlapping the photoelectric conversion units 100 to function as an antireflection film.

The fourth insulating unit 145 may be a silicon oxide film, for example.

Sixth Embodiment

Figure 12:
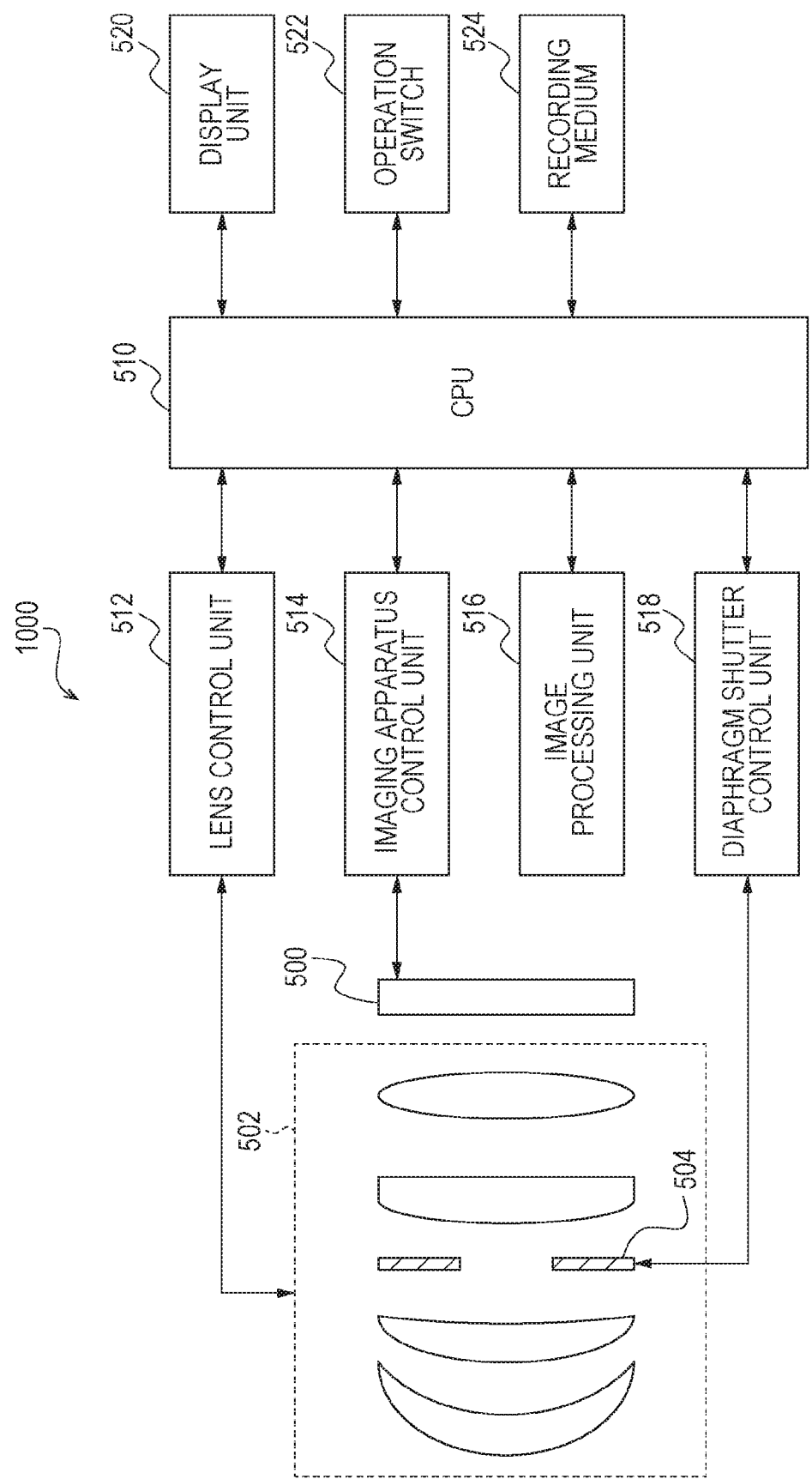
FIG. 12 is a block diagram illustrating a schematic configuration of a photoelectric conversion system according to a sixth embodiment of the disclosure.

FIG. 12 illustrates a block diagram illustrating a schematic configuration of an photoelectric conversion system 1000 according to a sixth embodiment.

The photoelectric conversion apparatuses according to the first to fifth embodiments are applicable to various photoelectric conversion systems. The photoelectric conversion systems to which the aforementioned photoelectric conversion apparatuses are applicable include, but are not particularly limited to, apparatuses such as a digital still camera, a digital camcorder, a surveillance camera, a copier, a facsimile, a cellular phone, an on-vehicle camera, an observation satellite, and a medical camera. A camera module including an optical system such as a lens and the photoelectric conversion apparatus is also included in the photoelectric conversion system 1000.

The photoelectric conversion system includes, as illustrated in FIG. 12, the photoelectric conversion apparatus 500, an imaging optical system 502, a CPU 510, a lens control unit 512, an imaging apparatus control unit 514, an image processing unit 516, a diaphragm shutter control unit 518, a display unit 520, an operation switch 522, and a recording medium 524.

The imaging optical system 502 is an optical system that forms an optical image of an object and includes a lens group and a diaphragm 504. The diaphragm 504 has a function that adjusts the amount of light in image capturing by performing opening diameter adjustment and also has a function as a shutter that adjusts the exposure time in still image capturing. The lens group and the diaphragm 504 are held such that they can move forward and backward in the optical axis direction. The movement of the lens group and diaphragm 504 in conjunction realizes a magnification effect (zoom function) and a focal point adjustment function. The imaging optical system 502 may be integrated with the photoelectric conversion apparatus system or may be an imaging lens that is attachable to the photoelectric conversion apparatus system.

The photoelectric conversion apparatus 500 is arranged to have its image pickup area in an image space of the imaging optical system 502. The photoelectric conversion apparatus 500 performs photoelectric conversion on an object image formed by the imaging optical system 502 and outputs the result as an image signal or a focus detection signal. Although the photoelectric conversion apparatus 500 according to the first embodiment is illustrated in FIG. 12, one of the photoelectric conversion apparatus 600 to 900 according to the second to fifth embodiments may be used.

The lens control unit 512 performs a magnification operation and focal point adjustment by controlling forward and backward driving of the lens group in the imaging optical system 502 and includes a circuit and a processing device configured to realize the functions. The diaphragm shutter control unit 518 adjusts the amount of captured light by changing the opening diameter of the diaphragm 504 (or by adjusting the aperture value) and includes a circuit and a processing device configured to realize the function.

The CPU 510 is a control device within a camera that is responsible for various controls over the camera main body and includes an arithmetic operation unit, a ROM, a RAM, an A/D converter, a D/A converter, a communication interface circuit and so on. The CPU 510 controls operations of the components within the camera based on a computer program stored in the ROM, for example to execute a series of image-capturing operations such as AF, image capturing, image processing, and recording including detection of a focal point state (focus detection) of the imaging optical system 502. The CPU 510 also functions as a signal processing unit.

The imaging apparatus control unit 514 controls operations by the photoelectric conversion apparatus 100 and performs A/D conversion on a signal output from the photoelectric conversion apparatus 500 and transmits the result to the CPU 510 and includes a circuit and a control device configured to realize the functions. The A/D conversion function may be included in the photoelectric conversion apparatus 500. The image processing unit 516 generates an image signal by performing image processing such as γ-conversion and color interpolation on the A/D converted signal and includes a circuit and a control device configured to realize the functions. The display unit 520 is a display device such as a liquid crystal display (LCD) and displays information regarding a shooting mode of the camera, a preview image before capturing, an image for checking after capturing, a focusing state as a result of focus detection and so on. The operation switch 522 includes a power switch, a release (capturing trigger) switch, a zoom operation switch, and a shooting mode selection switch. The recording medium 524 records a captured image and may be contained in the photoelectric conversion system or may be a memory card, for example, attachable to the photoelectric conversion system.

Any one of the photoelectric conversion apparatuses according to the first to fifth embodiments may be applied to the photoelectric conversion system 1000 for enhanced performance.

Seventh Embodiment

Figure 13A:
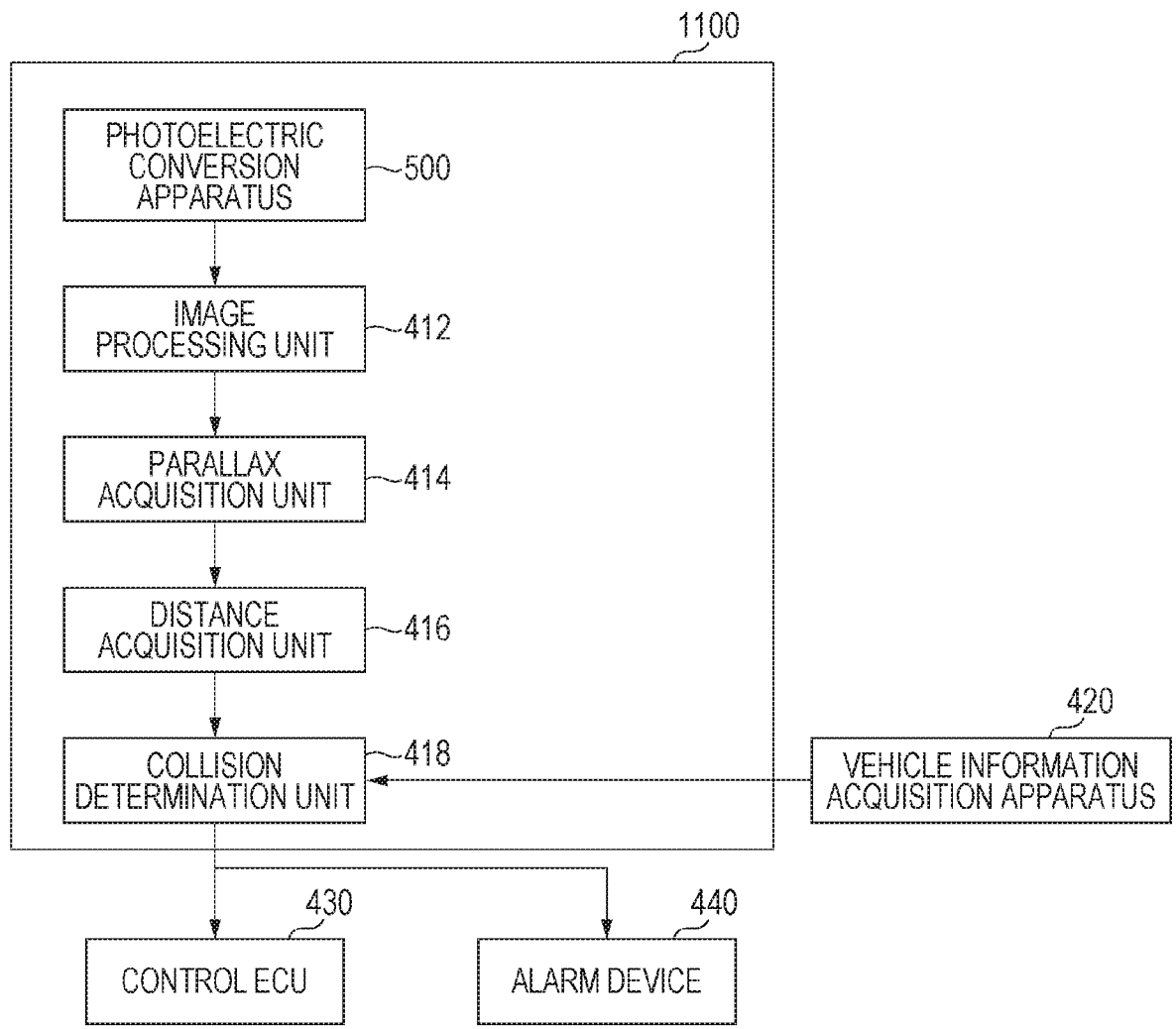
FIGS. 13A and 13B illustrate an example of a photoelectric conversion system according to a seventh embodiment of the disclosure.
Figure 13B:
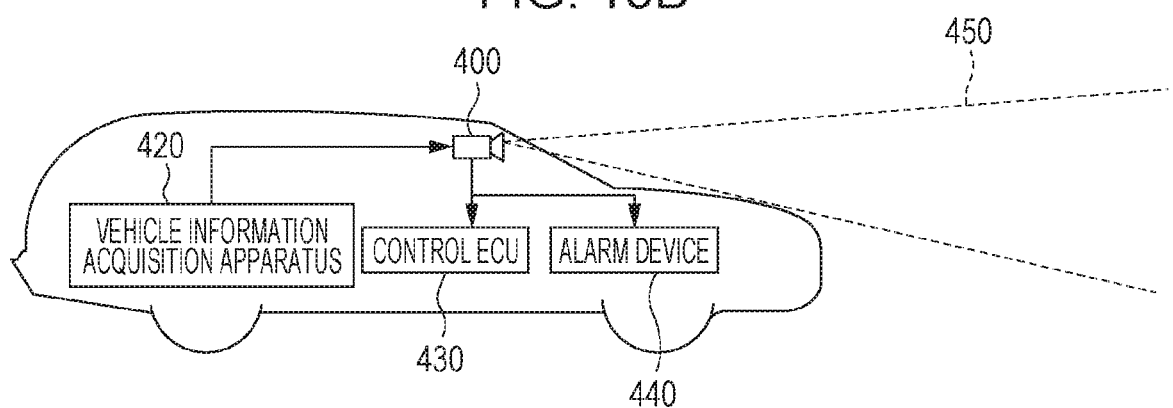

An photoelectric conversion system 1100 and a moving body according to a seventh embodiment will be described with reference to FIG. 13A and FIG. 13B. FIG. 13A and FIG. 13B illustrate configurations of the photoelectric conversion system 1100 and the moving body according to this embodiment.

FIG. 13A illustrates an example of the photoelectric conversion system 1100 relating to an on-vehicle camera. The photoelectric conversion system 1100 includes the photoelectric conversion apparatus 500. According to this embodiment, the photoelectric conversion apparatus may be any one of the photoelectric conversion apparatuses according to the second to fifth embodiments. The photoelectric conversion system 1100 further includes an image processing unit 412 configured to perform an image process on a plurality of image data pieces acquired by the photoelectric conversion apparatus and a parallax acquisition unit 414 configured to calculate a parallax (or phase difference between parallax images) from the plurality of image data pieces acquired by the photoelectric conversion apparatus. The photoelectric conversion system 1100 further includes a distance acquisition unit 416 that is a processing device configured to calculate a distance to a target object based on the calculated parallax and a collision determination unit 418 that is a processing device configured to determine whether there is a collision possibility or not based on the calculated distance. Here, the parallax acquisition unit 414 and the distance acquisition unit 416 are examples of an information acquisition unit configured to acquire information such as distance information to a target object. In other words, the distance information is information regarding a parallax, a de-focusing amount, a distance to a target object and so on. The collision determination unit 418 may use such distance information to determine a collision possibility. These processing devices may be implemented by specially designed hardware modules or may be implemented by a general-purpose hardware that performs arithmetic operations based on software modules. The processing devices may be implemented by a field programmable gate array (FPGA), an application specific integrated circuit (ASIC) or the like. The processing devices may be implemented by a combination thereof.

The photoelectric conversion system 1100 is connected to a vehicle information acquisition apparatus 420 and can acquire vehicle information such as a vehicle speed, a yaw rate, and a steering angle. The photoelectric conversion system 1100 is also connected to a control ECU 430 that is a control device configured to output a control signal causing a braking force on the vehicle based on the determination result from the collision determination unit 418. In other words, the control ECU 430 is an example of a moving body control unit that controls a moving body based on distance information. The photoelectric conversion system 1100 is further connected to an alarm device 440 that issues an alert to a driver based on the determination result from the collision determination unit 418. For example, in a case where there is a high collision possibility as the determination result from the collision determination unit 418, the control ECU 430 performs vehicle control for avoiding a collision and mitigating a damage by braking, releasing an acceleration pedal, inhibiting the engine output or the like. The alarm device 440 issues an alert to a user by outputting an alert such as a sound, displaying alert information on a screen of a car navigation system, for example, vibrating a sheet belt or a steering or the like.

According to this embodiment, an image of a surrounding such as a front or a back of a vehicle is captured by the imaging system 1100. FIG. 13B illustrates the photoelectric conversion system 1100 that captures a front (image capturing range 450) of a vehicle. The vehicle information acquisition apparatus 420 transmits an instruction to cause the photoelectric conversion system 1100 to operate and perform image capturing. By using any one of the photoelectric conversion apparatuses according to the first to fifth embodiments, the photoelectric conversion system 1100 according to this embodiment can increase the accuracy of focusing.

Having described the examples of the controls to prevent a collision against another vehicle, embodiments are also applicable to a control over autonomous driving by following another vehicle, a control over autonomous driving by keeping the vehicle within a traffic lane and so on. The photoelectric conversion system is applicable not only to vehicles such as an automobile but also to a moving body (transport equipment) such as a ship, an aircraft or an industrial robot. A moving apparatus in a moving body (transport equipment) may be a moving unit such as an engine, a motor, a wheel and a propeller. The photoelectric conversion system is applicable not only to a moving body but also to an apparatus that applies object recognition broadly such as intelligent transport systems (ITS).

The aspect of the embodiments can provide a photoelectric conversion apparatus that can easily reduce damage to photoelectric conversion units in manufacturing and reduces malfunctions of transistors.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-107035 filed Jun. 4, 2018, which is hereby incorporated by reference herein in its entirety.

What is claimed is:

1. A photoelectric conversion apparatus comprising:
a semiconductor substrate having a first surface on which light is incident and a second surface facing the first surface, and having one or a plurality of photoelectric conversion units performing photoelectric conversion on the incident light and accumulating first electric charges of a first polarity, one or a plurality of first transistors having a first gate formed on the second surface, and one or a plurality of second transistors having a second gate formed on the second surface, the second gate having a gate length shorter than a gate length of the first gate;
a first fixed charge film continuously provided on the first surface directly or with an insulating film in between in an area overlapping the one or a plurality of photoelectric conversion units, the one or a plurality of first transistors, and the one or a plurality of second transistors in a plan view viewed from a direction perpendicular to the first surface of the semiconductor substrate, the first fixed charge film having fixed charges of the first polarity; and
a second fixed charge film provided on a side of the first fixed charge film opposite to a side of the semiconductor substrate provided directly or with an insulating film in between in an area overlapping the one or a plurality of second transistors and the first fixed charge film in the plan view, the second fixed charge film having fixed charges of a second polarity,
wherein, at a position overlapping with the one or the plurality of photoelectric conversion portions in the plan view, the second fixed charge film is not provided or a thickness of the second fixed charge film is less than a thickness of the first fixed charge film.

2. The photoelectric conversion apparatus according to claim 1,
wherein the semiconductor substrate has, in the plan view,
a pixel area having the plurality of photoelectric conversion units and the plurality of first transistors arranged two-dimensionally, and
the plurality of second transistors provided outside the pixel area,
wherein the first fixed charge film is provided in the pixel area and an area overlapping the plurality of second transistors in the plan view, and wherein the second fixed charge film is provided in an area overlapping the plurality of second transistors and is not provided in the pixel area, in the plan view.

3. The photoelectric conversion apparatus according to claim 2, wherein the first fixed charge film contains at least one of hafnium oxide, aluminum oxide, and tantalum oxide.

4. The photoelectric conversion apparatus according to claim 1, wherein the second fixed charge film includes a silicon oxide film having an O/Si ratio equal to or higher than 1.50 and equal to or lower than 1.85.

5. The photoelectric conversion apparatus according to claim 1, wherein the second fixed charge film contains silicon nitride.

6. The photoelectric conversion apparatus according to claim 1, wherein the second fixed charge film contains silicon oxynitride.

7. The photoelectric conversion apparatus according to claim 1, wherein, in an area overlapping the one or a plurality second transistors in the plan view, the second fixed charge film has a thickness greater than a thickness of the first fixed charge film.

8. The photoelectric conversion apparatus according to claim 1,
wherein the first fixed charge film has, in order from a side of the semiconductor substrate formed,
a layer having a first refractive index lower than a refractive index of the semiconductor substrate, and
a layer having a second refractive index lower than the first refractive index.

9. The photoelectric conversion apparatus according to claim 1, wherein the first fixed charge film is formed by stacking layers formed of aluminum oxide and tantalum oxide in order from the side of the semiconductor substrate formed.

10. The photoelectric conversion apparatus according to claim 2,
wherein the first fixed charge film contains at least one of hafnium oxide, aluminum oxide, and tantalum oxide, and
wherein the second fixed charge film contains silicon nitride.

11. The photoelectric conversion apparatus according to claim 1,
wherein the photoelectric conversion apparatus has a microlens array being arranged a side of the first surface of the semiconductor substrate, the microlens array including an area having a plurality of lenses arranged two-dimensionally, and
wherein the at least one second transistor is provided outside the area having the plurality of lenses arranged two-dimensionally in the plan view.

12. The photoelectric conversion apparatus according to claim 1,
wherein the one or a plurality first transistors have a source and a drain in a well having the second electric charges of the second polarity as majority carriers, and
wherein the one or a plurality second transistors have a source and a drain in a well having the first electric charges of the first polarity as majority carriers.

13. The photoelectric conversion apparatus according to claim 1, wherein a separation area is provided between the one or a plurality first transistors and the one or a plurality second transistors in the plan view in the semiconductor substrate, and contains at least one of an insulating material, polysilicon, and metal.

14. A photoelectric conversion apparatus comprising:
a semiconductor substrate having a first surface on which light is incident and a second surface facing the first surface, and having one or a plurality photoelectric conversion units performing photoelectric conversion on the incident light and accumulating electrons, one or a plurality first transistors electrically connected to the one or a plurality photoelectric conversion units and having a first gate formed on the second surface, and one or a plurality second transistors having a second gate formed on the second surface, the second gate having a gate length shorter than a gate length of the first gate;
a first film continuously provided on the first surface directly or with an insulating film in between in an area overlapping the one or a plurality photoelectric conversion units and the one or a plurality second transistors in a plan view viewed from a direction perpendicular to the first surface of the semiconductor substrate, and containing at least one of hafnium oxide, aluminum oxide, and tantalum oxide; and
a second film provided directly or with an insulating film in between in an area overlapping the one or a plurality second transistors and the first film in the plan view and containing at least one of silicon oxide and silicon nitride, the silicon oxide having an O/Si ratio equal to or higher than 1.50 and equal to or lower than 1.85,
wherein, at a position overlapping with the one or the plurality of first transistors in the plan view, the second film is not provided or a thickness of the second film is less than a thickness of the first film.

15. The photoelectric conversion apparatus according to claim 14,
wherein the semiconductor substrate has, in the plan view,
a pixel area having the plurality of photoelectric conversion units and a plurality of first transistors arranged two-dimensionally, and
the plurality of second transistors provided outside the pixel area,
wherein the first film is provided in the pixel area and an area overlapping the plurality of second transistors in the plan view, and
wherein the second film is provided in an area overlapping the plurality of second transistors and is not provided in the pixel area, in the plan view.

16. The photoelectric conversion apparatus according to claim 14, wherein, in an area overlapping the one or a plurality second transistors in the plan view, the second film has a thickness greater than a thickness of the first film.

17. The photoelectric conversion apparatus according to claim 15,
wherein the one or a plurality first transistors have a source and a drain in a well having holes as majority carriers, and
wherein the one or a plurality second transistors have a source and a drain in a well having electrons as majority carriers.

18. A photoelectric conversion system comprising:
the photoelectric conversion apparatus according to claim 1; and
a processing device configured to process a signal output from the photoelectric conversion apparatus.

19. A moving body comprising:
the photoelectric conversion apparatus according to claim 1;
a moving apparatus;
a processing device configured to acquire information from a signal output from the photoelectric conversion apparatus; and
a control device configured to control the moving apparatus based on the information.

* * * * *